(12) United States Patent
Takenaka

(10) Patent No.: US 6,614,053 B1
(45) Date of Patent: Sep. 2, 2003

(54) ACTIVE MATRIX SUBSTRATE, ELECTROOPTICAL DEVICE, AND METHOD OF PRODUCING ACTIVE MATRIX SUBSTRATE

(75) Inventor: Satoshi Takenaka, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/524,275

(22) Filed: Mar. 13, 2000

(30) Foreign Application Priority Data

Mar. 11, 1999 (JP) .......................................... 11-065220
Mar. 11, 1999 (JP) .......................................... 11-065221

(51) Int. Cl.[7] ......................................... H01L 31/0368
(52) U.S. Cl. ............................. 257/66; 257/48; 257/57; 257/59; 257/72; 349/42; 349/43; 349/54; 349/139; 349/140
(58) Field of Search .............................. 257/48, 57, 59, 257/66, 72; 349/42, 43, 54, 139, 140

(56) References Cited

U.S. PATENT DOCUMENTS

| | | | |
|---|---|---|---|
| 5,536,950 A | * 7/1996 | Liu et al. | ........................ 257/59 |
| 5,900,644 A | * 5/1999 | Ying et al. | |
| 6,013,923 A | * 1/2000 | Huang | .......................... 257/59 |
| 6,184,947 B1 | * 2/2001 | Ozaki et al. | ................... 349/42 |
| 6,188,453 B1 | * 2/2001 | Matsuoka et al. | |
| 2001/0030635 A1 | * 10/2001 | Kodate et al. | ................. 345/87 |
| 2002/0084460 A1 | * 7/2002 | Takizawa et al. | ............. 257/72 |

FOREIGN PATENT DOCUMENTS

| | | | |
|---|---|---|---|
| JP | 3-250748 | * 11/1991 | |
| JP | 7-234413 | * 9/1995 | |

* cited by examiner

Primary Examiner—Nathan J. Flynn
Assistant Examiner—Ahmed N. Sefer
(74) Attorney, Agent, or Firm—Oliff & Berridge, PLC

(57) ABSTRACT

The invention provides an active matrix substrate which allows the film quality of a MIS transistor to be evaluated easily and accurately, an electrooptical device using such an active matrix substrate, and a method of producing such an active matrix substrate. On an active matrix substrate, a film quality evaluation region with a size of 1 mm square is formed at a location where neither an image display area, a scanning line driving circuit, a data line driving circuit, nor a signal line is formed. A semiconductor film (silicon film) for film quality evaluation is formed in the film quality evaluation region using the same layer as a heavily doped source/drain region of a TFT and doped with the same impurity at the same concentration as the source/drain region. The semiconductor film for film quality evaluation is exposed through an opening formed through interlayer insulating films, so that it is possible to immediately start evaluation of the film equality.

15 Claims, 19 Drawing Sheets

(B)

ACTIVE MATRIX SUBSTRATE, ELECTROOPTICAL DEVICE, AND METHOD OF PRODUCING ACTIVE MATRIX SUBSTRATE

BACKGROUND OF THE INVENTION

1. Field of Invention

The present invention relates to an active matrix substrate on which transistors are formed, an electrooptical device using this active matrix substrate, and a method of producing the active matrix substrate. More particularly, the present invention relates to a technique of forming a film quality evaluation region for evaluating films used to form transistors.

2. Description of Related Art

A representative active matrix substrate on which transistors and signal lines are formed is one for use in a liquid crystal display (electrooptical device). Some active matrix substrates of this type include a driving circuit disposed thereon. In this case, a plurality of scanning lines and data lines are disposed on an insulating substrate, and furthermore, a plurality of pixels are disposed in the form of an array at intersections of the scanning lines and data lines. Each pixel includes a pixel electrode and a pixel switching thin film transistor (hereafter referred to as a TFT) connected to a scanning line and a data line. On the insulating substrate, in an area outside an image display area, there are disposed a data line driving circuit for supplying an image signal to the respective data lines and a scanning line driving circuit for supplying a scanning signal to the respective scanning lines. These driving circuits are formed of a plurality of TFTs.

Of these TFTs, each TFT for switching a pixel includes, as shown in FIGS. 5(A) and 5(B), a gate electrode 3a formed simultaneously with the scanning lines, source regions 1f and 1d electrically connected via a first contact hole 4a formed in a first interlayer insulating film 4 to a source electrode 6a which is a part of a data line 30, drain regions 1g and 1e electrically connected via a second contact hole 4a formed in the first interlayer insulating film 4 to a drain electrode 6a which is formed of an aluminum film, or the like, simultaneously with the data lines 30. A second interlayer insulating film 7 is formed in a layer above the first interlayer insulating film 4. A third contact hole 8a is formed in this second interlayer insulating film 7, and a pixel electrode 9a is electrically connected to the drain electrode 6d via the third contact hole 8a. The structure described above is also employed for TFTs used to form the driving circuits.

In the active matrix substrate, when various elements, such as the TFT 50 have been formed using a semiconductor process, various characteristics are tested. If the active matrix substrate fails this test, various analyses are performed and the result is fed back. For example, analyses are performed in terms of the impurity concentrations of the source and drain regions and crystallinity of the channel region 1a. Conventionally, such an analysis is performed as follows. First, the surface of the sample, on which the TFTs 50 for switching pixels or used in the driving circuits, is lustered so as to successively remove the second interlayer insulating film 7, the first interlayer insulating film 4, the gate electrode 3a, and the gate insulating film 2, until the channel 1a or the source/drain region is exposed. Thereafter, elemental analysis by way of SIMS (secondary ion mass spectrometry) or X-ray analysis is performed.

In the conventional method of analyzing the source/drain region or the channel region 1a, a long time is needed to remove the second interlayer insulating film 7, the first interlayer insulating film 4, the gate electrode 3a, and the gate insulating film 2. Although the thickness of a film to be analyzed is as small as 50 nm to 100 nm, it is required to remove an interlayer insulating film having a thickness as large as 1 μm. To analyze the channel region 1a, it is required to remove the gate electrode 3a with a thickness of 400 nm. Another problem is that high-accuracy analysis is difficult because the channel region 1a of the TFT 50 which is finally exposed after performing long-time lustering has a small area of at most 100 μm square.

SUMMARY OF THE INVENTION

In view of the above, the present invention to provides an active matrix substrate which allows the film quality of a transistor, such as a TFT, to be evaluated easily and accurately, and also provides an electrooptical device using such an active matrix substrate.

The present invention also provides a method of producing an active matrix substrate having a film quality evaluation region which is formed through substantially the same process as that through which a film of a transistor is formed, without needing an additional process, thereby making it possible to accurately evaluate film quality.

According to the present invention, as described above, there is provided a film quality evaluation region in which a semiconductor film for film quality evaluation is formed of the same layer as the semiconductor film used to form a transistor. Alternatively, a semiconductor film for film quality evaluation and a gate insulating film for film quality evaluation are formed using the same layers as a channel region and a gate insulating film, respectively, of a transistor, whereby the film quality evaluation, such as elemental analysis or crystallinity analysis, of the semiconductor film forming the channel region or the source/drain region of the transistor or an impurity distribution at an interface between the gate insulating film and the channel region, can be performed by analyzing the film quality evaluation region.

In the analysis using the film quality evaluation region, unlike the analysis performed directly upon the transistor, it is possible to immediately start the analysis without having to remove the interlayer insulating film and the gate electrode, because the film quality region is exposed through the opening formed through the interlayer insulating film which is formed in the evaluation region simultaneously with the interlayer insulating film in the transistor region. This makes it possible to easily evaluate the film quality in a short time. The film quality evaluation region can be formed over a large area without influencing the characteristics of the transistor. The large film quality evaluation region allows high-accuracy analysis for various items.

According to an aspect of the present invention, to achieve the above objects, there is provided an active matrix substrate that may include a transistor and a signal line both formed on a substrate. The active matrix substrate may further include a film quality evaluation region including a semiconductor film for film quality evaluation, the semiconductor film for film quality evaluation being formed of the same layer as a semiconductor film used to form the transistor, the film quality evaluation region being disposed at one or more locations on the substrate at which neither the transistor nor the signal line is formed. In the following description, a MIS (metal insulator semiconductor) transistor is employed as the transistor. Note that the MIS transistor is not limited to those whose gate is formed of a metal, but those whose gate is formed of a conductive silicon or any other similar material.

In this active matrix substrate according to the present invention, it is desirable that the semiconductor film for film quality evaluation be exposed through an opening formed in an interlayer insulating film in the evaluation region, the interlayer insulating film in the evaluation region being formed of the same layer as an interlayer insulating film formed above the transistor.

In this active matrix substrate according to the present invention, because the semiconductor film for film quality evaluation is formed in the film quality evaluation region using the same layer as the semiconductor film used to form the transistor, analysis, such as elemental analysis or crystallinity analysis, of the semiconductor film forming the channel region and the source/drain region of the transistor can be performed by analyzing the film quality evaluation region. In the analysis using the film quality evaluation region, unlike the analysis performed directly upon the transistor, it is possible to immediately start the analysis without having to remove the interlayer insulating film and the gate electrode, because the film quality region is exposed through the opening formed through the interlayer insulating film which is formed in the evaluation region simultaneously with the interlayer insulating film in the transistor region. This makes it possible to easily evaluate the film quality in a short time. The semiconductor film for film quality evaluation can be formed so as to have a large area in the film quality evaluation region without influencing the characteristics of the transistor. The large film quality evaluation region allows high-accuracy analysis for various items.

In the active matrix substrate according to the present invention, the semiconductor film for film quality evaluation may be formed of the same layer as a source/drain region of the transistor and doped with the same impurity at the same concentration as the source/drain region.

To produce the active matrix substrate having the above-described structure, after forming a semiconductor film used to form the transistor and simultaneously forming the semiconductor film for film quality evaluation in a region to be used as the film quality evaluation region, and then forming a gate insulating film used to form the transistor and simultaneously forming a gate insulating film in the region to be used as the film quality evaluation region, a process is performed which includes the steps of: forming a conductive film used to form a gate electrode of the transistor and then patterning the conductive film so as to form the gate electrode and simultaneously removing the conductive film from the film quality evaluation region; selectively introducing an impurity into the semiconductor film via the gate insulating film so as to form source and drain regions of the transistor and simultaneously introducing the impurity also into the semiconductor film for film quality evaluation via the gate insulating film in the evaluation region; forming the interlayer insulating film in a layer on the surface of the gate electrode and simultaneously forming the interlayer insulating film in the evaluation region, in a layer on the surface of the gate insulating film in the evaluation region; and forming a contact hole, for connection to the transistor, in the interlayer insulating film and simultaneously forming, in the film quality evaluation region, the opening in the interlayer insulating film in the evaluation region and in the gate insulating film in the evaluation region so that the semiconductor film for film quality evaluation is exposed.

In this production method, the semiconductor film for film quality evaluation has substantially the same process history as the source and drain regions of the transistor, and thus the film quality of the source and drain regions of the transistor can be accurately evaluated by analyzing the semiconductor film for film quality evaluation. Furthermore, in this production method, the film quality evaluation region can be formed using the production steps of producing the transistor without needing an additional step.

In the present invention, the source/drain region of the transistor may include a lightly doped source/drain region and a heavily doped source/drain region. In this case, the semiconductor film for film quality evaluation may be formed of the same layer as one of the lightly doped source/drain region and the heavily doped source/drain region, and the semiconductor film for film quality evaluation may be doped with the same impurity at the same concentration as the one of the lightly doped source/drain region and the heavily doped source/drain region.

To produce the active matrix substrate having the above-described structure, after forming a semiconductor film used to form the transistor and simultaneously forming the semiconductor film for film quality evaluation in a region to be used as the film quality evaluation region, and then forming a gate insulating film used to form the transistor and simultaneously forming a gate insulating film in the region to be used as the film quality evaluation region, a process is performed which includes the steps of: forming a conductive film used to form a gate electrode of the transistor and then patterning the conductive film so as to form the gate electrode and simultaneously removing the conductive film from the film quality evaluation region;

selectively introducing a high concentration of impurity and a low concentration of impurity into the semiconductor film via the gate insulating film so as to form the lightly doped source/drain region and the heavily doped source/drain region of the transistor, respectively, and simultaneously introducing one of the high concentration impurity and the low concentration of impurity into the semiconductor film for film quality evaluation via the gate insulating film in the evaluation region; forming the interlayer insulating film in a layer on the surface of the gate electrode and simultaneously forming the interlayer insulating film in the evaluation region, in a layer on the surface of the gate insulating film in the evaluation region; and forming a contact hole, for connection to the transistor, in the interlayer insulating film and simultaneously forming, in the film quality evaluation region, the opening in the interlayer insulating film in the evaluation region and in the gate insulating film in the evaluation region so that the semiconductor film for film quality evaluation is exposed.

In the case where the source/drain region of the above-described transistor includes a lightly doped source/drain region and a heavily doped source/drain region, it is desirable that the semiconductor film for film quality evaluation include a first semiconductor film for film quality evaluation and a second semiconductor film for film quality evaluation, the first semiconductor film for film quality evaluation being formed of the same layer as the lightly doped source/drain region and doped with the same impurity at the same concentration as the lightly doped source/drain region, the second semiconductor film for film quality evaluation being formed of the same layer as the heavily doped source/drain region and doped with the same impurity at the same concentration as the heavily doped source/drain region. This make it possible to evaluate both regions when the source/drain region of the transistor includes the lightly doped source/drain region and the heavily doped source/drain region.

To produce the active matrix substrate having the above-described structure, after forming a semiconductor film used to form the transistor and simultaneously forming the semiconductor film for film quality evaluation in a region to be used as the film quality evaluation region, and then forming a gate insulating film used to form the transistor and simultaneously forming a gate insulating film in the region to be used as the film quality evaluation region, a process is performed which may include the steps of: forming a conductive film used to form a gate electrode of the transistor and then patterning the conductive film so as to form the gate electrode and simultaneously removing the conductive film from the film quality evaluation region; selectively introducing a high concentration of impurity and a low concentration of impurity into the semiconductor film via the gate insulating film so as to form the lightly doped source/drain region and the heavily doped source/drain region of the transistor, respectively, and simultaneously introducing the high concentration impurity and the low concentration of impurity into the semiconductor film for film quality evaluation via the gate insulating film in the evaluation region thereby forming a first semiconductor film for film quality evaluation and a second semiconductor film for film quality evaluation; forming the interlayer insulating film in a layer on the surface of the gate electrode and simultaneously forming the interlayer insulating film in the evaluation region, in a layer on the surface of the gate insulating film in the evaluation region; and forming a contact hole, for connection to the transistor, in the interlayer insulating film and simultaneously forming, in the film quality evaluation region, the opening in the interlayer insulating film in the evaluation region and in the gate insulating film in the evaluation region so that the semiconductor film for film quality evaluation is exposed.

In this production method, the first semiconductor film for film quality evaluation and the second semiconductor film for film quality evaluation both have substantially the same process histories as the lightly doped source/drain region and the heavily doped source/drain region, respectively, of the transistor, and thus the film quality of the source and drain regions of the transistor can be accurately evaluated by analyzing the semiconductor film for film quality evaluation. Furthermore, in this production method, the film quality evaluation region can be formed using the production steps of producing the transistor without needing an additional step.

In the active matrix substrate according to the present invention, when the film quality evaluation region is used to evaluate the source/drain region of the transistor, it is desirable that the film evaluation region have a greater area than the source/drain region of the transistor.

In the present invention, the film quality evaluation region may be formed so as to evaluate a channel region of the transistor. In this case, the semiconductor film for film quality evaluation is formed of the same layer as the channel region of the transistor, such that the semiconductor film for film quality evaluation and the channel region are both either intrinsic or channel-doped with the same impurity at the same concentration.

To produce the active matrix substrate having the above-described structure, after forming a semiconductor film used to form the transistor and simultaneously forming the semiconductor film for film quality evaluation in a region to be used as the film quality evaluation region, and then forming a gate insulating film used to form the transistor and simultaneously forming a gate insulating film in the region to be used as the film quality evaluation region, a process is performed which includes the steps of: forming a conductive film used to form a gate electrode of the transistor and then patterning the conductive film so as to form the gate electrode and simultaneously removing the conductive film from the film quality evaluation region; selectively introducing an impurity into the semiconductor film via the gate insulating film while covering the semiconductor film for film quality evaluation with a mask so as to form source and drain regions of the transistor; and forming a contact hole, for connection to the transistor, in the interlayer insulating film and simultaneously forming, in the film quality evaluation region, the opening in the interlayer insulating film in the evaluation region and in the gate insulating film in the evaluation region so that the semiconductor film for film quality evaluation is exposed.

In this production method, the semiconductor film for film quality evaluation has substantially the same process history as the channel region of the transistor, and thus the film quality of the channel region of the transistor can be accurately evaluated by analyzing the semiconductor film for film quality evaluation. Furthermore, in this production method, the film quality evaluation region can be formed using the production steps of producing the transistor without needing an additional step.

In the active matrix substrate according to the present invention, when the semiconductor film for film quality evaluation is formed of the same layer as the channel region of the transistor such that the semiconductor film for film quality evaluation and the channel region are both either intrinsic or channel-doped with the same impurity at the same concentration, the film quality evaluation region may include a gate insulating film for film quality evaluation formed on the surface of the semiconductor film for film quality evaluation wherein the gate insulating film for film quality evaluation is formed of the same layer as the gate insulating film of the transistor.

In this active matrix substrate according to the present invention, it is desirable that the gate insulating film for film quality evaluation be exposed through an opening formed in an insulating film in the evaluation region, the insulating film in the evaluation region being formed of the same layer as an interlayer insulating film formed above the transistor.

In this active matrix substrate according to the present invention, because the semiconductor film for film quality evaluation and the gate insulating film for film quality evaluation are formed in the film quality evaluation region using the same layers as the channel region and the gate insulating film, respectively, of the transistor, film quality, such as an impurity distribution at an interface between the gate insulating film and the channel region of the transistor, can be evaluated by evaluating the film quality evaluation region. In the evaluation using the film quality evaluation region, unlike the evaluation performed directly upon the transistor, it is possible to immediately start the evaluation without having to remove the interlayer insulating film and the gate electrode, because the film quality region is exposed through the opening formed through the insulating film which is formed in the evaluation region simultaneously with the interlayer insulating film in the transistor region. This makes it possible to easily evaluate the film quality in a short time. The film quality evaluation region can be formed over a large area without influencing the characteristics of the transistor. The large area of the film quality evaluation region allows high-accuracy analysis of the film by way of SIMS.

To produce the active matrix substrate having the above-described structure, after forming the channel region of the transistor and simultaneously forming the semiconductor film for film quality evaluation and in a region to be used as the film quality evaluation region, and then forming the gate insulating film of the transistor and simultaneously forming the gate insulating film for film quality evaluation in the region to be used as the film quality evaluation region, a process is performed which includes the steps of: forming a gate electrode of the transistor and simultaneously forming a conductive film in the film quality evaluation region; forming source and drain regions of the transistor by introducing an impurity via a predetermined mask; forming the interlayer insulating film in a layer on the surface of the gate electrode and simultaneously forming the interlayer insulating film in the evaluation region, in a layer on the surface of the conductive film in the evaluation region; forming a contact hole, for connection to the MIS transistor, in the interlayer insulating film and simultaneously forming the opening in the film quality evaluation region so that the conductive film is exposed through the opening; and etching the conductive film via the opening thereby removing the conductive film so that the gate insulating film for film quality evaluation is exposed through the opening.

In this production method, the gate insulating film for film quality evaluation and the semiconductor film for film quality evaluation have substantially the same process histories as the gate insulating film and the channel region, respectively, of the transistor, and thus the film quality of the gate insulating film and the channel region of the transistor can be accurately evaluated by analyzing the gate insulating film for film quality evaluation and the semiconductor film for film quality evaluation.

The present invention also provides another method of producing an active matrix substrate, comprising the steps of: forming a channel region and a gate insulating film of the thin film transistor and simultaneously forming, in a region to be used as the film quality evaluation region, the semiconductor film for film quality evaluation and the gate insulating film in the evaluation region; forming the gate electrode and the scanning line and simultaneously forming a short-circuit line for electrically connecting at least some of the scanning line and the data line to one another and still simultaneously forming a conductive film in the film quality evaluation region; forming source and drain regions of the thin film transistor by introducing an impurity via a predetermined mask; forming the interlayer insulating film in a layer on the surface of the gate electrode and the scanning line and simultaneously forming the interlayer insulating film in the evaluation region, in a layer on the surface of the conductive film in the evaluation region; forming a contact hole, for connection to the thin film transistor, in the interlayer insulating film and simultaneously forming a cut-off hole so that a predetermined part, which will be cut off later, of the short-circuit line is exposed through the cut-off hole and sill simultaneously forming the opening in the film quality evaluation region so that the conductive film is exposed through the opening; and cutting off the short-circuit line by etching the predetermined part of the short-circuit line and simultaneously removing the conductive film by way of etching via the opening so that the semiconductor film for film quality evaluation and the gate insulating film for film quality evaluation are exposed through the opening in the film quality evaluation region. In this production method, the film quality evaluation region can be exposed using the production step of cutting off the short-circuit lines for electrostatic discharge protection without needing an additional step.

In the present invention, the area of the film quality evaluation region is considerably greater than the channel region of the transistor. More specifically, the area is as large as about 1 mm$^2$. Therefore, in addition to elemental analysis by way of SIMS, it is also possible to evaluate crystallinity of the semiconductor film for film quality evaluation (channel region) by way of Raman scattering, or the like. Thus, the film quality evaluation region is very useful for evaluating the transistor, such as a thin film transistor formed of a polycrystal semiconductor film obtained by crystallizing an amorphous semiconductor film.

In the present invention, the semiconductor film for film quality evaluation may be formed in an area containing the area where the opening described above is formed. That is, the semiconductor film for film quality evaluation may be formed over an area greater than the area where the opening is formed. Instead, the semiconductor film for film quality evaluation may be formed inside the opening described above.

In the present invention, the transistor may be a thin film transistor, and an active matrix substrate for use in an electrooptical device, such as a liquid crystal display, may be realized by forming: an image display area including scanning lines, data lines, and pixel electrodes, a gate electrode of each thin film transistor being electrically connected to one scanning line, a source region of each thin film transistor being electrically connected to one data line, a drain region of each thin film transistor being electrically connected to one pixel electrode; a scanning line driving circuit and a data line driving circuit, disposed in a peripheral area outside the image display area, for outputting a signal to the scanning lines and the data lines; and signal lines for supplying signals to the driving circuits. If the active matrix substrate and an opposite substrate on which an opposite electrode is formed is combined together, and an electrooptical material, such as a liquid crystal, is disposed between the active matrix substrate and the opposite substrate, then an electrooptical device, such as a liquid crystal display, is obtained. In this case, the film quality evaluation region is formed at one or more locations on the substrate, where neither the image display are, the scanning lines, the data lines, nor the signal lines are formed.

BRIEF DESCRIPTION OF THE DRAWINGS

FIG. 13 is a block diagram of an active matrix substrate used in an electrooptical device according to a sixth embodiment of the present invention;

DETAILED DESCRIPTION OF PREFERRED EMBODIMENTS

Embodiments of the present invention are described below with reference to the accompanying drawings.
(General Construction of Electrooptical Device)

Before describing specific embodiments, the general construction of an electrooptical device is first described with reference to FIGS. 1 and 2.

Figure 1:
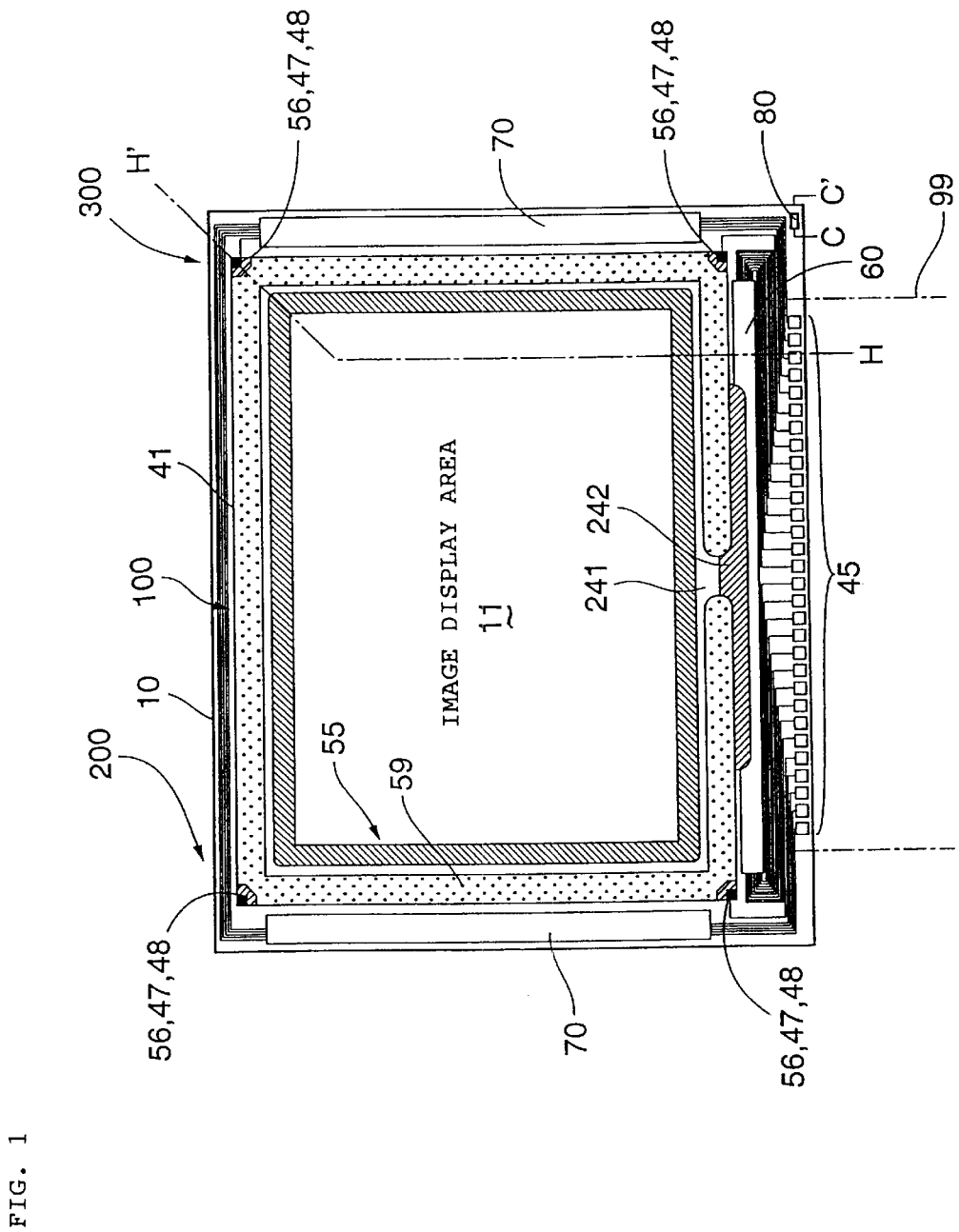
FIG. 1 is a plan view of an electrooptical device, seen from the side of its opposite substrate, according to the present invention.

FIG. 1 is a plan view of an electrooptical device, seen from the side of its opposite substrate, according to the present invention. FIG. 2 is a cross-sectional view taken along line II–II' of FIG. 1.

Figure 2:
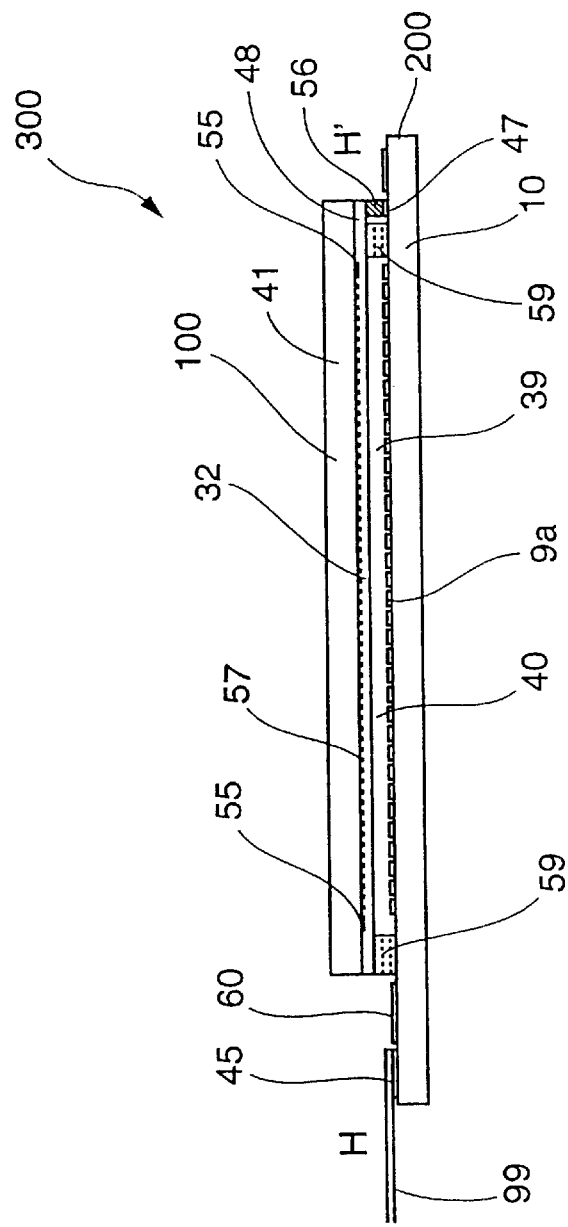
FIG. 2 is a cross-sectional view of the electrooptical device, taken along line II–II ' of FIG. 1.

As shown in FIG. 1 and FIG. 2, an electrooptical device 300 for use in a projector, or the like, generally includes an active matrix substrate 200 (active matrix substrate) including pixel electrodes 9a formed, in the form of an array, on the surface of an insulating substrate 10, such as quartz glass or heat-resistant glass, an opposite substrate 100 including opposite electrodes 32 formed on the surface of an insulating substrate 41, such as quartz glass or heat-resistant glass, and a liquid crystal 39 serving as an electrooptical material disposed in a sealed fashion between the above-described substrates. The active matrix substrate 200 and the opposite substrate 100 are adhesively bonded to each other via a sealing material 59 containing a gap material such that they are spaced a predetermined distance (cell gap) apart from each other. The sealing material 59 containing the gap material defines a liquid crystal sealing region 40 between the active matrix substrate 200 and the opposite substrate 100, and a liquid crystal 39 is seated in this liquid crystal sealing region 40.

The opposite substrate 100 is smaller in size than the active matrix substrate 200, and thus a peripheral part of the active matrix substrate 200 extends beyond the edge of the opposite substrate 100. As a result, the driving circuits (the scanning line driving circuit 70 and the data line driving circuit 60) and input/output terminals 45 formed on the active matrix substrate 200 are not covered by the opposite substrate 100 but exposed to the outside. The sealing material 59 is partially removed so as to form a liquid crystal injection hole 241. After the opposite substrate 100 and the active matrix substrate 200 are adhesively bonded to each other, if the region enclosed by the sealing material 59 is pumped to a low pressure, a liquid crystal 39 can be injected therein through the liquid crystal injection hole 241. After injecting the liquid crystal 39, the liquid crystal injection hole 241 is filled with a sealing agent 242. On the active matrix substrate 200, there is also disposed a light blocking film 55 which defines an image display area 11 in the region surrounded by the sealing material 59. On the opposite substrate 100, a light blocking film 57 is formed over areas corresponding to boundary areas between adjacent pixel electrodes 9a formed on the active matrix substrate 200.

A polarizer, or the like, is disposed on a light incidence surface or a light emerging surface of the opposite substrate 100 and the active matrix substrate 200, depending on whether the electrooptical device is of the normally white mode or the normally black mode.

In the electrooptical device 300 constructed in the above-described manner, an image signal is applied to the respective pixel electrodes 9a via data lines (not shown) and pixel switching TFTs (which will be described later) on the active matrix substrate 200 so as to control the alignment of the liquid crystal 39 between the pixel electrode and the opposite electrode 32 for each pixel thereby displaying an image corresponding to the image signal. Thus, in this active matrix substrate 200, it is required to supply an image signal to the pixel electrodes 9a via the data lines and the TFTs 50 and also supply a predetermined voltage to the opposite electrode 32. In the electrooptical device 300, first electrodes 47 for vertical connection are formed using aluminum, or the like, on the surface of the active matrix substrate 200 during some processing step, such as a data line formation step, such that one first electrode 47 is disposed at each location corresponding to each corner of the opposite substrate 100. On the other hand, second electrodes 48 for vertical connection are formed on the opposite substrate 100 using an ITO (indium tin oxide) film, or the like, when the opposite substrate 4 is produced so that one second electrode 48 is located at each corner of the opposite substrate 100. The first electrodes 47 for vertical connection are electrically connected to the second electrodes 48 for vertical connection via a conductive material 56 containing conductive particles, such as a silver powder or gold-plated fibers dispersed in an epoxy-based adhesive. Thus, in this electrooptical device 300, it is not required to connect flexible wiring boards to both the active matrix substrate 200 and the opposite substrate 100. Instead, one flexible wiring board 99 is connected only to the active matrix substrate 200 thereby making it possible to supply predetermined signals to both the active matrix substrate 200 and the opposite substrate 100.

First Embodiment
(Construction of Active Matrix Substrate)

Figure 3:
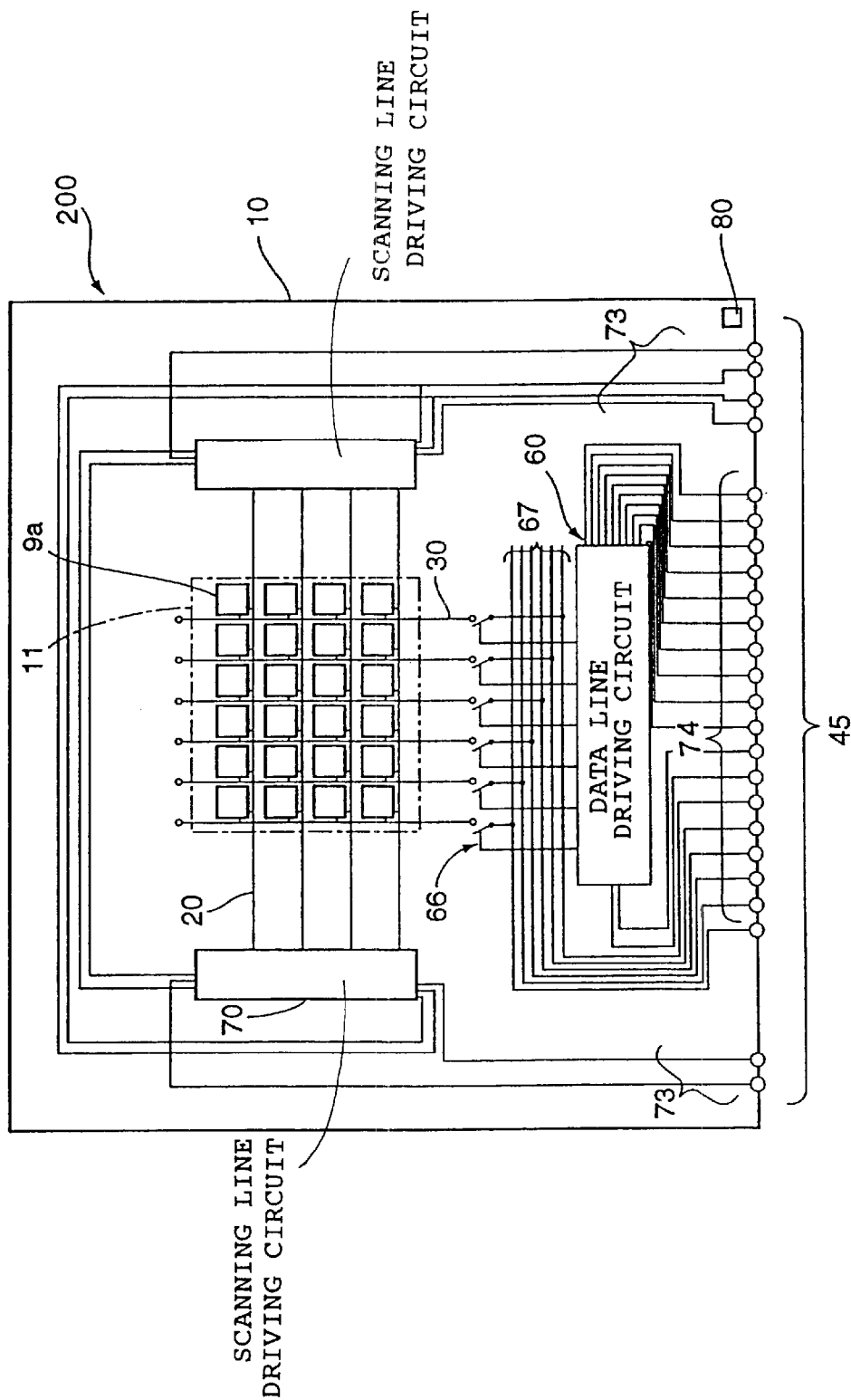

FIG. 3 is a block diagram schematically illustrating the construction of an active matrix substrate 200 used in an electrooptical device 300 according to a first embodiment of the present invention.

In the active matrix substrate 200 including driving circuits disposed thereon, according to the present embodiment, as shown in FIG. 3, a plurality of scanning lines 20 and a plurality of data lines 30 are disposed on an insulating substrate 10 such that they cross one another, and pixel electrodes 9a are disposed in the form of an array wherein each pixel electrode 9a is connected to one of scanning lines 20 and data lines 30. The scanning lines 20 are formed of a tantalum film, an aluminum film, or an aluminum alloy film. The data lines 30 are formed of an aluminum film or an aluminum alloy. The scanning lines 20 and the data lines 30 may be formed either in a single layer structure or a multilayer structure. The area in which the pixel electrodes 9a are disposed serves as an image display area 11.

In an area (peripheral area) outside the image display area 11, on the insulating substrate 10, there is disposed a data line driving circuit 60 for supplying an image signal to the respective data lines 30. A scanning line driving circuit 70 for supplying a scanning signal for selecting a pixel to the respective scanning lines 20 is disposed in both areas adjacent to ends of the scanning lines 20. The driving circuits 60 and 70 are constructed of TFTs which are formed simultaneously with pixel switching TFTs.

The data line driving circuit 60 includes: an X shift register; a sample-and-hold circuit 66 including TFTs serving as analog switches which operate in response to a signal output from the X shift register; and six image signal lines 67 for transmitting an image signal divided into six phases. In the present embodiment, the X shift register of the data line driving circuit 60 is formed in a four-phase configuration. A start signal, a clock signal, and an inverted clock signal are supplied via input/output terminals 45 to the X shift register thereby driving the data line driving circuit 60. In the sample-and-hold circuit 66, each TFT operates in response to a signal output from the X shift register so that an image signal supplied via an image signal line 67 is transferred to a data line 30 with predetermined timing thereby supplying the image signal to each pixel electrode 9a.

A start signal, a clock signal, and an inverted clock signal are supplied via input/output terminals 45 to the scanning line driving circuit 70 thereby driving the scanning line driving circuit 70.

On the active matrix substrate 200 of the present embodiment, in an area on the same side of the insulating substrate 10 as that where the data line driving circuit 60 is formed, there are disposed a great number of input/output terminals 45 formed of a conductive film, such as an aluminum film or a similar metal film, a metal silicide film, or an ITO film, so that a constant power supply voltage, a modulated image signal (image signal), and other various driving signals are input via the input/output terminals 45. Signal lines 73 and 74 formed of a low-resistance metal film, such as an aluminum film for driving the scanning line driving circuit 60 and the data line driving circuit 70 extend from the respective input/output terminals 45.

(Structure of Pixel and TFT)

Figure 4:
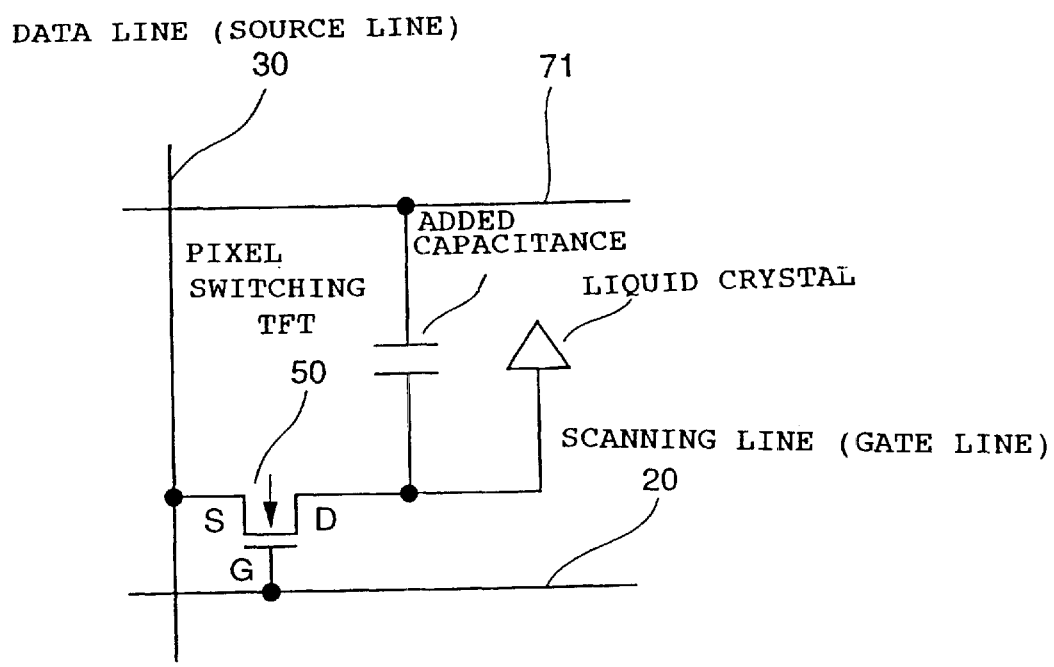
FIG. 4 illustrates an equivalent circuit of a pixel of the active matrix substrate shown in FIG. 3.
Figure 5:
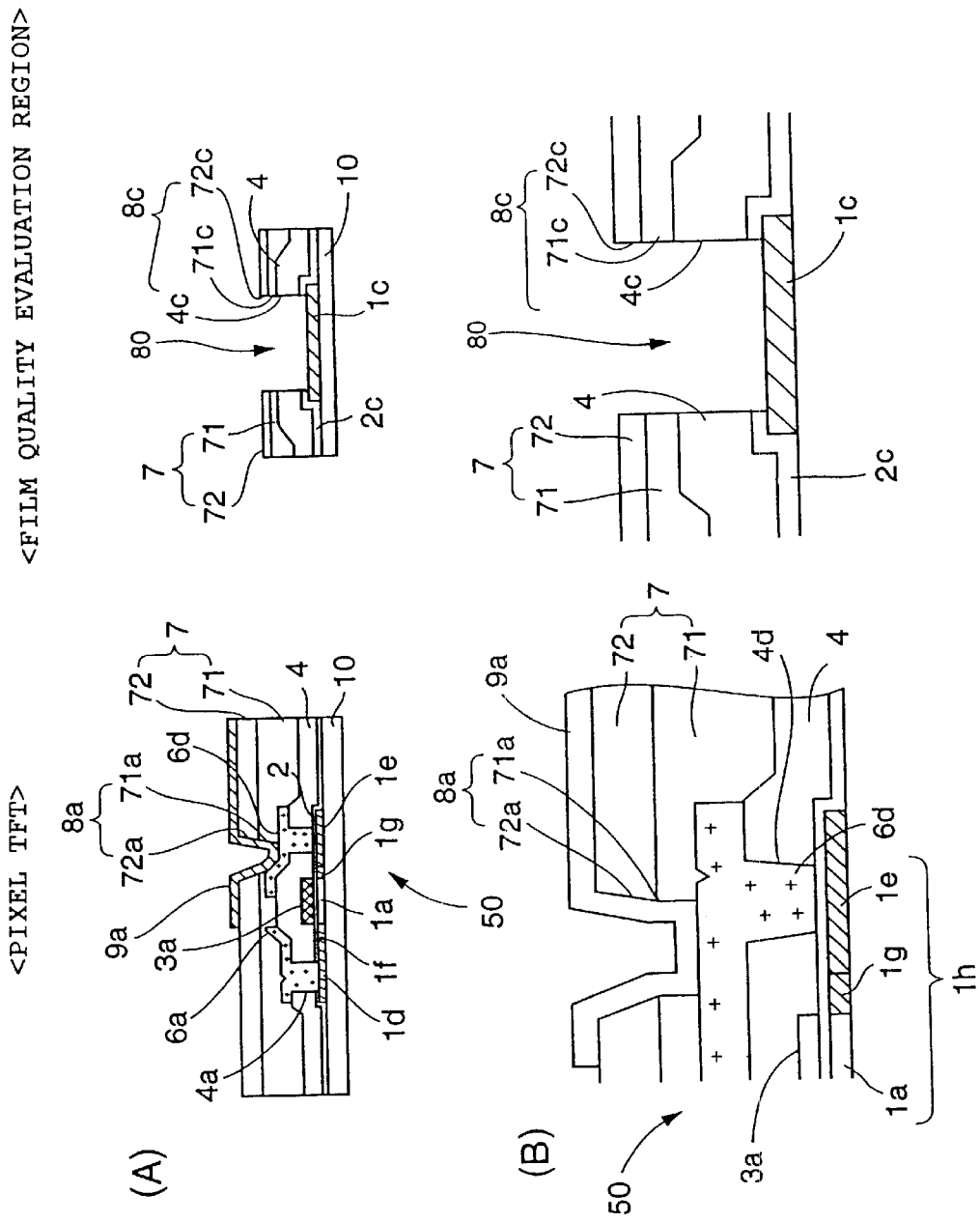
FIG. 5(A) illustrates a cross section of a pixel TFT formed on the active matrix substrate shown in FIG. 3 also a cross section of the film quality evaluation region taken along line V–V' of FIG. 1.
FIG. 5(B) illustrates, in the form of enlarged cross-sectional views, a part of the pixel TFT and a part of the film quality evaluation region.

FIG. 4 illustrates an equivalent circuit of a pixel of the active matrix substrate shown in FIG. 3. FIG. 5(A) illustrates a cross section of a pixel switching TFT formed in a pixel shown in FIG. 3 and also illustrates a cross section of a film quality evaluation region, which will be described later with reference to FIG. 1, taken along line V–V' of FIG. 1, wherein a part of the pixel switching TFT and a part of the film quality evaluation region are illustrated, in the form of enlarged cross-sectional views, in FIG. 5(B).

As shown in FIG. 4, each pixel includes a pixel switching TFT 50 connected to a scanning line 20 and a data line 30. In some cases, a capacitance line 75 is formed for each pixel so as to form an additional capacitance (storage capacitance/holding capacitance) added to each pixel.

As shown in FIG. 5(A), each TFT 50 includes a gate electrode 3a formed simultaneously with the scanning lines 20, a heavily doped source region 1d electrically connected via a first contact hole 4a formed in a first interlayer insulating film 4 to a source electrode 6a which is a part of a data line 30, a heavily doped drain region 1e electrically connected via a second contact hole 4d formed in the first interlayer insulating film 4 to a drain electrode 6d formed of an aluminum film, or the like, which is formed simultaneous with the data line 30. A second interlayer insulating film 7 is formed in a layer above the first interlayer insulating film 4. A third contact hole 8a is formed in this second interlayer insulating film 7, and the pixel electrode 9a is electrically connected to the drain electrode 6d via the third contact hole. In the present embodiment, the TFT 50 is constructed in an LDD structure in which a lightly doped source region 1f and a lightly doped drain region 1g are formed at locations corresponding to opposite ends of the gate electrode 3a.

In the present embodiment, the second interlayer insulating film 7 is formed in a double-layer structure consisting of an insulating film 71 and an insulating film 72, wherein the insulating film 71 is formed by coating perhydropolysilazane or a composition containing perhydropolysilazane and then baking it, and the insulating film 72 is a silicon oxide film, or the like, with a thickness of about 50 nm to 1500 nm formed by way of CVD, or the like. Perhydropolysilazane used herein as the coating material is one of inorganic polysilazanes which can be converted to a silicon oxide film by baking it in the atmosphere. A specific example of perhydropolysilazane is an inorganic polymer of —(SiH$_2$NH)— and is soluble in an organic solvent, such as xylene. This type of perhydropolysilazane is available, for example, from Tonen Corp. After coating such an inorganic polymer diluted in an organic solvent (20% xylene, for example) by way of a spin-coating technique (at 20001 rpm for 20 sec, for example), if baking is performed at 450° C. in the atmosphere, then the inorganic polymer reacts with water or oxygen and an amorphous silicon oxide film is obtained which is as dense as a silicon oxide film formed by way of CVD. The insulating film 71 (silicon oxide film) formed by this method can be used as an interlayer insulating film which can planarize physical steps arising from drain electrodes 6d, or the like. This prevents the alignment of the liquid crystal from being disturbed by physical steps.

(Film Quality Evaluation Region)

In the active matrix substrate 200 described above, when the respective elements have been formed using a semiconductor process, electrical characteristics are tested. If the active matrix substrate fails this test, various analyses are performed and the result is fed back. For example, the impurity profile of the source and drain regions of the TFT 50 is evaluated, and the result is fed back.

To perform such an evaluation, the active matrix substrate 200 has a film quality evaluation region 80 with a rectangular shape and a size of about 1 mm square, wherein it is formed, as shown in FIGS. 1 and 3, in a substrate's corner (the lower right corner in FIGS. 1 and 3) where no elements, such as the image display area 11, the scanning line driving circuit 70, the data line driving circuit 60, and the signal lines 73 and 74, are formed.

In this film quality evaluation region 80, as shown in FIGS. 5(A) and 5(B), a semiconductor film (silicon film) 1c for film quality evaluation is formed using the same layer as the semiconductor film 1h used to form the channel region 1a and the source and drain regions of the TFT 50 and is doped with the same impurity at the same concentration as the heavily doped source/drain region (heavily doped source region 1d the heavily doped drain region 1e). In this film quality evaluation region 80, the semiconductor film 1c for film quality evaluation is exposed through an opening 8c formed through a gate insulating film 2c in the evaluation region formed of the same layer as the gate insulating film 2, and through interlayer insulating films 4, 71, and 72 in the evaluation region. Herein, the semiconductor film 1c for film quality evaluation is formed over an area greater than the area of the source/drain region (heavily doped source region 1d and the heavily doped drain region 1e) of the TFT 50. Furthermore, the area of the semiconductor film 1c for film quality evaluation is also greater than the area of the opening 8c and is formed in a region containing a region where the opening 8c is formed.

Thus, because the active matrix substrate 200 of the present embodiment has the film quality evaluation region 80 in which the semiconductor film 1c for film quality evaluation doped with the same impurity at the same concentration as the heavily doped source region 1d and the heavily doped drain region 1e of the TFT 50, it is possible to evaluate film quality, such as the impurity profile of the heavily doped source region 1d and heavily doped drain region 1e of the TFT 50 by performing elemental analysis upon the semiconductor film 1c for film quality evaluation in the film quality evaluation region 80. Because the film quality region 80 is exposed through the opening 8c formed through the gate insulating film 2c in the evaluation region and the interlayer insulating films 4, 71, and 72, it is possible to immediately start evaluation without having to remove the interlayer insulating films 4, 71, and 72, the gate electrode 3a, and the gate insulating film 2. This makes it possible to easily evaluate the film quality in a short time. The film quality evaluation region 80 can be formed over a large area without influencing the characteristics of the TFT 50. The large film quality evaluation region 80 makes it possible to perform high-accuracy elemental analysis in a depth direction by way of SIMS while lustering a part of the film quality evaluation region 80. The area of the film quality evaluation region 80 is also greater than the heavily doped source region 1d and the heavily doped drain region of the TFT 50. More specifically, the area is as large as about 1 mm$^2$. Therefore, in addition to elemental analysis by way of SIMS, it is also possible to evaluate crystallinity of the semiconductor film 1c for film quality evaluation (semiconductor film 1h) by way of X-ray crystal analysis, Raman scattering, or the like. Thus, the film quality evaluation region 80 is very useful for evaluating the TFT 50 formed of a polycrystal semiconductor film 1h obtained by crystallizing an amorphous semiconductor film.

As can be seen from FIG. 1, the film quality evaluation region 80 of the present embodiment is formed in the part, extending beyond the end of the opposite substrate 100, of the active matrix substrate 200. This allows film quality evaluations to be performed at various production stages in addition to a stage after completion of producing the active matrix substrate 200. For example, after testing the operation of an electrooptical device 300 obtained by assembling the active matrix substrate 200 with an opposite substrate 100, the film quality can be evaluated using the film quality evaluation region 80.

(Method of Producing the Active Matrix Substrate 200)

Figure 6:
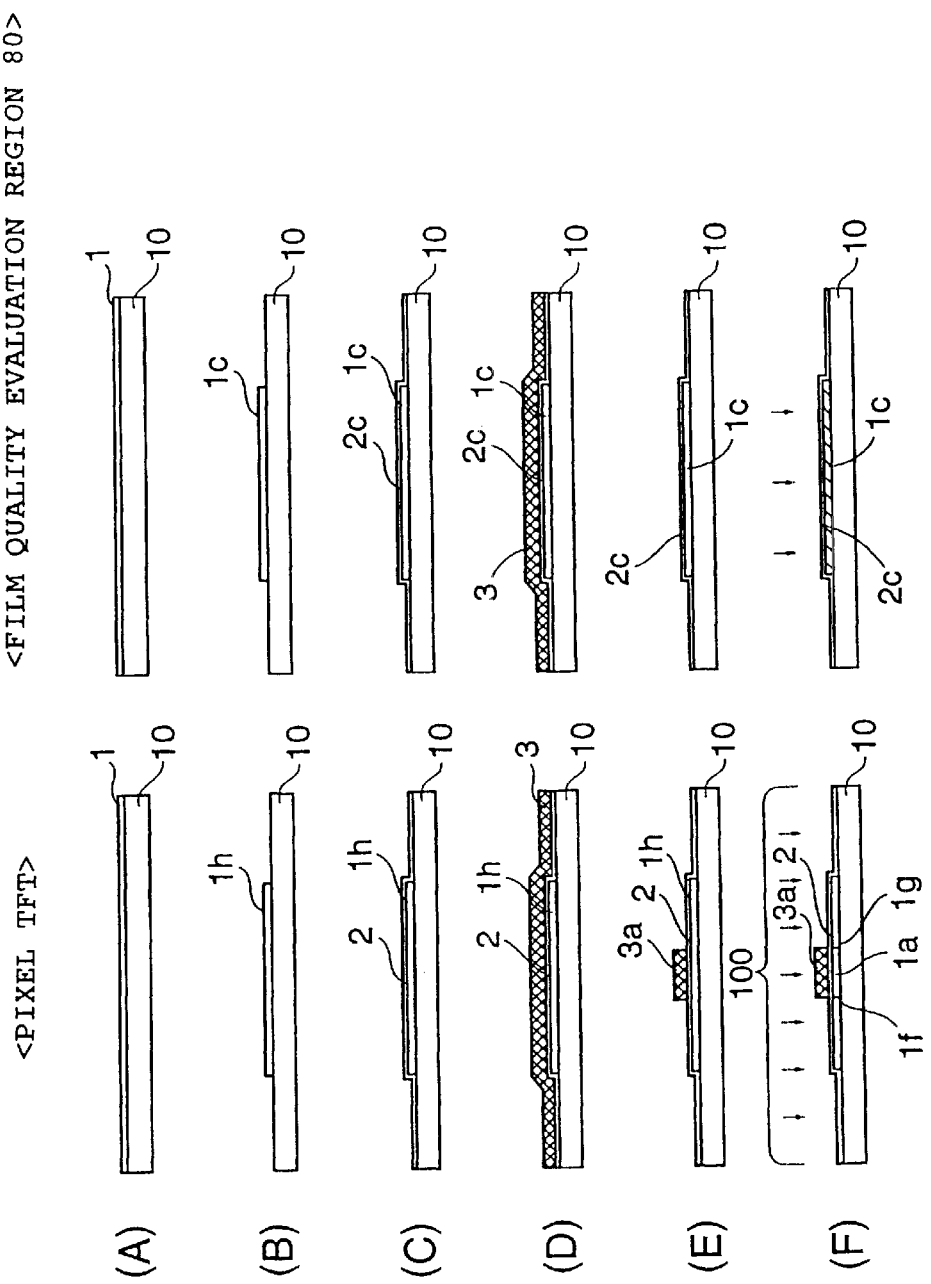
FIGS. 6(A)–6(F) are cross-sectional views illustrating production steps of the active matrix substrate shown in FIGS. 5(A)–5(B)
Figure 7:
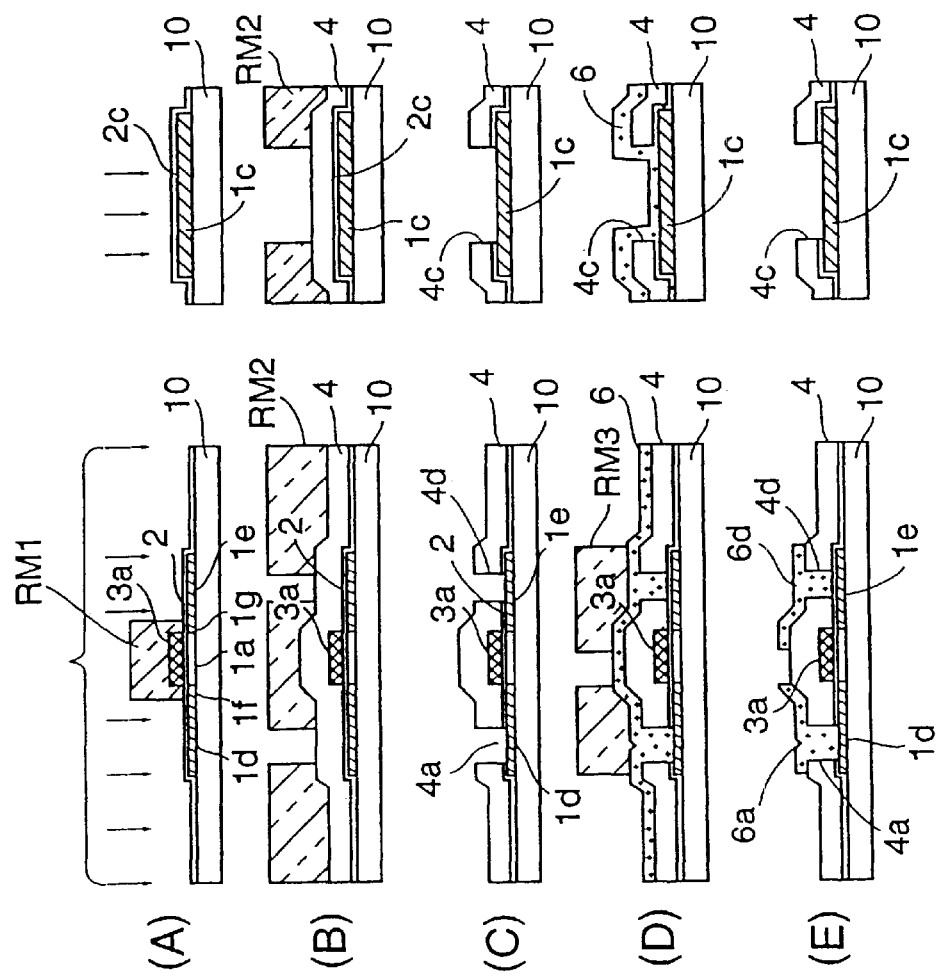
FIGS. 7(A)–7(E) are cross-sectional views illustrating production steps following those shown in FIGS. 6(A)–6(F)
Figure 8:
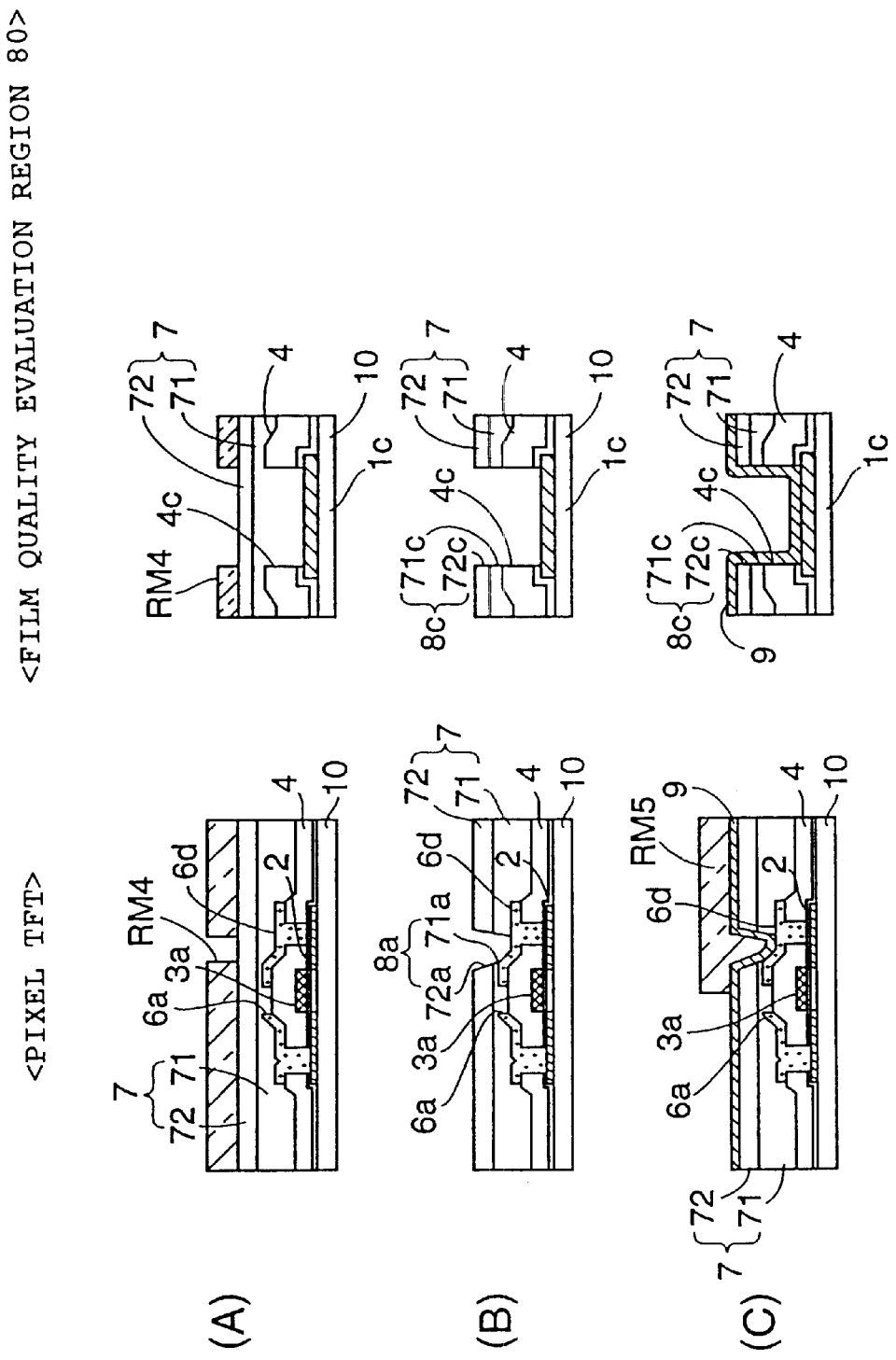
FIGS. 8(A)–8(C) are cross-sectional views illustrating production steps following those shown in FIGS. 7(A)–7(E)

A method of producing the active matrix substrate 200 while simultaneously forming the film quality evaluation region 80 is described below in reference with FIGS. 6 to 8 which are cross-sectional views illustrating production steps of the active matrix substrate 200 according to the present embodiment. In these figures, cross sections of a pixel TFT at various production steps are shown on the left side, and cross sections (of the film quality evaluation region 80) taken along line V–V' of FIG. 1 are shown on the right side.

First, as shown in FIG. 6(A), a semiconductor film 1 of polysilicon with a thickness of about 20 nm to 200 nm and more preferably of about 100 nm is formed by way of for example low pressure CVD either directly on a transparent insulating substrate 10 made of glass, such as alkali-free glass or quartz or indirectly via an underlying protective film (not shown) formed on the insulating substrate 10, over the entire surface thereof. Thereafter, the semiconductor film 1 is patterned using a photolithography technique so as to form an island of a semiconductor film 1h (active layer) in a pixel TFT region, as shown in FIG. 6(B). Simultaneously therewith, an island of semiconductor film 1c for film quality evaluation is formed in a film quality evaluation region 80.

The formation of the semiconductor film 1 may be accomplished by first depositing an amorphous silicon film using a low-temperature process and then crystallizing it by way of laser annealing, or the like, thereby forming a polysilicon film.

Then, as shown in FIG. 6(C), a silicon oxide film with a thickness of about 50 nm to 150 nm is formed by way of CVD, or the like, over the entire area of the insulating substrate 10 at a temperature of, for example, 400° C. Thus, in the pixel TFT region, the surface of the island-shaped semiconductor film 1h is covered with a gate insulating film 2. In the film quality evaluation region 80, on the other hand, a gate insulating film 2c in the evaluation region is formed on the surface of the island-shaped semiconductor film 1c for film quality evaluation.

Then, as shown in FIG. 6(D), a tantalum film 3 (conductive film), which will be used later to form a gate electrode and other elements, is formed on the entire area of the insulating substrate 10. The tantalum film 3 is then patterned using a photolithography process so as to form a gate electrode 3a in the pixel TFT region, as shown in FIG. 6(E). In this process, the tantalum film 3 in the film quality evaluation region 80 is completely removed.

Thereafter, as shown in FIG. 6(F), in the pixel TFT regions and the n-channel TFT regions of the driving circuits, impurity ions (phosphorus ions) are implanted using the gate electrode 3a as a mask to a low dose of about $0.1 \times 10^{13}/cm^2$ to $0.1 \times 10^{13}/cm^2$ so as to form a lightly doped source region 1f and a lightly doped drain region 1g both selfaligned relative to the gate electrode 3a in each pixel TFT region. In this process, the region just below the gate electrode 3a is not doped with the impurity ions and thus this region becomes a channel region 1a. Furthermore, during this process, the impurity is lightly doped in the film quality evaluation region 80 to the same dose as in the lightly doped source region 1f and the lightly doped drain region 1g.

Then, in the pixel TFT regions, as shown in FIG. 7(A), impurity ions (phosphorus ions) are heavily doped using a resist mask RM1 with a width greater than the width of the gate electrode 3a to a dose of about $0.1 \times 10^{15}/cm^2$ to $10 \times 10^{15}/cm^2$ thereby forming a heavily doped source region 1d and a heavily doped drain region 1e. In this process, the impurity is simultaneously doped into the film quality evaluation region 80 to the same dose as in the heavily doped source region 1d and the heavily doped drain region 1e.

Alternatively, the lightly doping of the impurity may be skipped, and only the heavily doping of the impurity (phosphorus) may be performed such that impurity ions are implanted using the resist mask RM1 with the width greater than the width of the gate electrode 3a. In this case, the source and drain regions are formed into an offset structure. Still alternatively, the heavily impurity doping may also be performed such that impurity ions (phosphorus ions) are implanted using the gate electrode 3a as a mask thereby forming the source and drain regions into a selfaligned structure.

Although not shown in the figure, to form p-channel TFTs in the peripheral driving circuit, the image display area, the film quality evaluation region 80, and the n-channel TFT regions are protected by a resist coating, and boron ions are implanted using the gate electrode as a mask to a dose of about $0.1 \times 10^{15}/cm^2$ to $10 \times 10^{15}/cm^2$ thereby forming source and drain regions for p-channel TFTs in a selfaligned fashion. Alternatively, the source and drain regions for p-channel TFTs may be formed in a similar manner to n-channel TFTs such that lightly doped regions are first formed in the polysilicon film by implanting an impurity (boron ions) to a dose of about $0.1 \times 10^{13}/cm^2$ to $10 \times 10^{13}/cm^2$ using the gate electrode as a mask, and then boron ions are implanted using a mask having a width greater than the width of the gate electrode to a high dose of about $0.1 \times 10^{15}/cm^2$ to $10 \times 10^{15}/cm^2$ thereby forming source and drain regions into the LDD (lightly doped drain) structure. Still alternatively, the lightly impurity doping may be skipped, and only the heavily doping of the impurity (phosphorus) may be performed such that impurity ions are implanted using a mask with the width greater than the width of the gate electrode thereby forming source and drain regions into an offset structure. The ion implantation process described above allows the peripheral circuit with a CMOS configuration to be formed on the substrate.

Thereafter, as shown in FIG. 7(B), a first interlayer insulating film 4 with a thickness of about 300 nm to 1500 nm of silicon oxide or NSG (silicate glass containing neither boron nor phosphorus) is formed in a layer on the gate electrode 3a and on the gate insulating film 2c in the evaluation region, using a CVD process, or the like, at a temperature of about 400° C.

A resist mask RM2 is then formed which will be used to form contact holes and openings in the first interlayer insulating film 4 by way of a photolithography process.

Thereafter, as shown in FIG. 7(C), in the pixel TFT region, contact holes 4a and 4d are formed in the first interlayer insulating film 4, at locations corresponding to parts of the source region 1d and the drain region 1e, respectively. On the other hand, in the film quality evaluation region 80, an opening 4c is formed in the first interlayer insulating film 4, at a location corresponding to a part of the semiconductor film 1c for film quality evaluation. Thus, in the film quality evaluation region 80, the semiconductor film 1c for film quality evaluation is exposed. The resist mask RM2 is then removed.

Thereafter, as shown in FIG. 7(D), an aluminum film 6 used to form the source electrodes and other elements is formed by way of sputtering, or the like, in a layer on the surface of the first interlayer insulating film 4.

A resist mask RM3 is then formed which will be used to pattern the aluminum film 6 by way of a photolithography process.

Thereafter, as shown in FIG. 7(E), the aluminum film 6 is patterned so as to form, in each pixel TFT region, an aluminum source electrode 6a which is a part of data line 30 and which is electrically connected to the heavily doped source region 1d via the first contact hole 4a, and also form a drain electrode 6d electrically connected to the heavily doped drain region 1e via the second contact hole 4d. In this process, the aluminum film 6 in the film quality region 80 is completely removed so that the semiconductor film 1c for film quality evaluation is exposed. The resist mask RM3 is then removed.

Thereafter, as shown in FIG. 8(A), an insulating film 71 is formed in a layer on the source electrode 6a, the drain electrode 6d, and the semiconductor film 1c for film quality evaluation, by coating and then baking perhydropolysilazane or a composition containing perhydropolysilazane. Furthermore, an insulating film 72 of silicon oxide with a thickness of about 50 nm to 1500 nm is formed on the surface of the insulating film 71, by way of a CVD process using TEOS at a temperature of, for example, about 400° C. These insulating films 71 and 72 form a second interlayer insulating film 7.

A resist mask RM4 is then formed which will be used to form contact holes and openings in the second interlayer insulating film 7 by way of a photolithography process.

Thereafter, as shown in FIG. 8(B), contact holes 71a and 72a are formed in the insulating films 71 and 72, respectively, of the second interlayer insulating film 7, at a location corresponding to the drain electrode 6d, wherein the contact holes 71a and 72a form a third contact hole 8a. In this process, openings 71c and 72c are formed in the insulating films 71 and 72, respectively, of the second interlayer insulating film 7 in the film quality evaluation region 80 thereby forming an opening 8c through which the semiconductor film 1c for film quality evaluation is exposed. The resist mask RM4 is then removed.

Thereafter, as shown in FIG. 8(C), an ITO (indium tin oxide) film 9 with a thickness of about 40 nm to 200 nm, which will be used to form a drain electrode, is formed in a layer on the surface of the second interlayer insulating film 7 by way of sputtering, or the like.

A resist mask RM5 is then formed which will be used to pattern the ITO film 9 by way of a photolithography process.

The ITO film 9 is patterned using the resist mask RM5. Thus, as shown in FIGS. 5(A) and 5(B), a pixel electrode 9a electrically connected to the drain electrode 6d via the third contact hole 8a is formed in each pixel TFT region. On the other hand, the ITO film 9 in the film quality evaluation region 80 is completely removed so that the semiconductor film 1c for film quality evaluation is exposed through the opening 8c.

Thus, thereafter, it is possible to immediately start evaluation of the film quality of the semiconductor film 1c for film quality evaluation via the opening 8c. Because the semiconductor film 1c for film quality evaluation has substantially the same process history as the heavily doped source region 1d and the heavily doped drain region 1e of the TFT 50, the film quality of the heavily doped source region 1d and the heavily doped drain region 1e of the TFT 50 can be accurately evaluated by analyzing the semiconductor film 1c for film quality evaluation. The film quality evaluation region 80 can be formed using the production steps of producing the TFT 50 without needing an additional step.

Second Embodiment

In the first embodiment described above, the heavily impurity doping into the semiconductor film 1c for film quality evaluation is performed in the step shown in FIG. 7(A) after performing the lightly impurity doping into the semiconductor film 1c in the step shown in FIG. 6(F). As a result, the semiconductor film 1c for film quality evaluation is doped with same impurity at the same concentration as the heavily doped source region 1d and the heavily doped drain region 1e.

Figure 9:
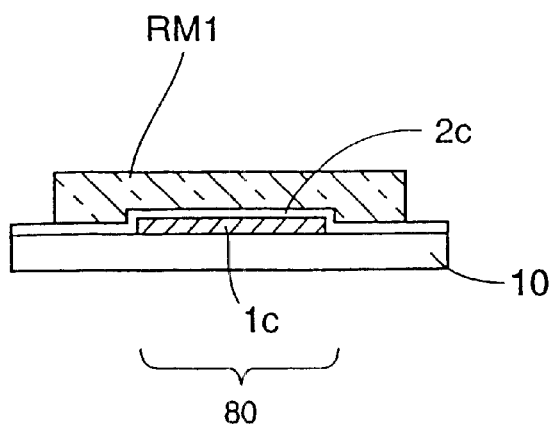
FIG. 9 is a cross-sectional view illustrating a high-concentration impurity doping process for forming a film quality evaluation region used to evaluate lightly-doped source/drain region of a TFT on an active matrix substrate according to a second embodiment of the present invention.

In the present embodiment, unlike the first embodiment, in the step shown in FIG. 7(A), after lightly doping the impurity into the semiconductor film 1c for film quality evaluation in the step shown in FIG. 6(F), the film quality evaluation region 80 is also covered with the resist mask RM1 as shown in FIG. 9. In this case, the semiconductor film 1c for film quality evaluation is doped with the same impurity at the same. concentration as the lightly doped source region 1f and the lightly doped drain region 1g. By analyzing this semiconductor film 1c for film quality evaluation in the evaluation region 80, it is possible to evaluate the film quality of the lightly doped source region 1f and the lightly doped drain region 1g of the TFT 50. Because the semiconductor film 1c for film quality evaluation has substantially the same process history as the lightly doped source region 1f and the lightly doped drain region 1g of the TFT 50, the film quality of the lightly doped source region 1f and the lightly doped drain region of the TFT 50 can be accurately evaluated by analyzing the semiconductor film 1c for film quality evaluation. Also in this case, the film quality evaluation region 80 can be formed using the production steps of producing the TFT 50 without needing an additional step.

Third Embodiment

In the first embodiment described above, in the step shown in FIG. 6(F), the impurity is lightly doped into the entire semiconductor film 1c for film quality evaluation, and then in the step shown in FIG. 7(A), the impurity is heavily doped in the entire semiconductor film 1c for film quality evaluation so that the semiconductor film 1c for film quality evaluation is doped with same impurity at the same concentration as the heavily doped source region 1d and the heavily doped drain region 1e.

Figure 10:
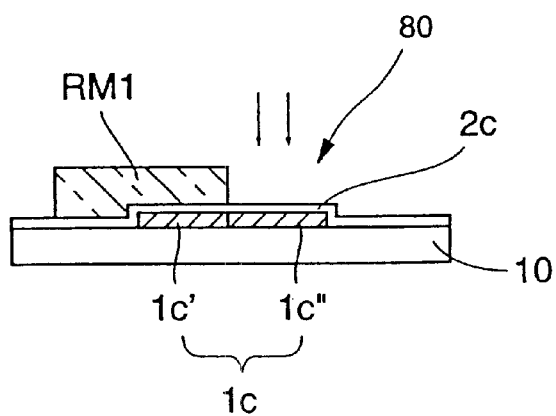
FIG. 10(A) is a cross-sectional view illustrating a high-concentration impurity doping process for forming a film quality evaluation region used to evaluate both lightly-doped source/drain region and heavily-doped source/drain region of a TFT on an active matrix substrate according to a third embodiment of the present invention.
FIG. 10(B) is a cross-sectional view of the film quality evaluation region formed using this process.
Figure 10:
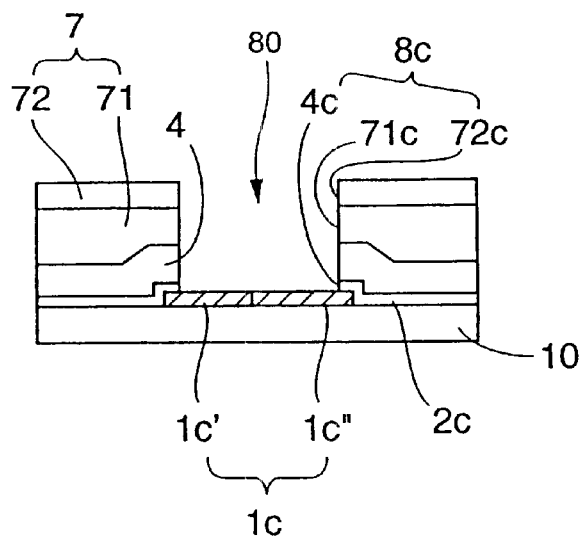

In the present embodiment, unlike the first embodiment, in the step shown in FIG. 7(A), after lightly doping the impurity into the semiconductor film 1c for film quality evaluation in the step shown in FIG. 6(F), the film quality evaluation region 80 is partly covered with a resist mask RM1 as shown in FIG. 10(A) so that a first semiconductor film 1c' for film quality evaluation and a second semiconductor film 1c'' for film quality evaluation are formed in the semiconductor film 1c for film quality evaluation as shown in FIG. 10(B) wherein the first semiconductor film 1c' is doped with the same impurity at the same concentration as the lightly doped source region 1f and the lightly doped drain region 1g, and the second semiconductor film 1c'' is doped with the same impurity at the same concentration as the heavily doped source region 1d and the heavily doped drain region 1e. Thus, by analyzing the first semiconductor film 1c' for film quality evaluation and the second semiconductor film 1c'' for film quality evaluation in the evaluation region 80, it is possible to evaluate the film quality of the heavily doped source region 1d, the heavily doped drain region 1e, the lightly doped source region 1f and the lightly doped drain region 1g of the TFT 50. The analysis of the semiconductor film 1c for film quality evaluation can give accurate evaluation of the source and drain regions of the TFT 50, because the semiconductor film 1c for film quality evaluation (the first semiconductor film 1c' for film quality evaluation and the second semiconductor film 1c'' for film quality evaluation) has substantially the same process history as the lightly doped source/drain region of the TFT 50 or the heavily doped source/drain region. Also in this case, the film quality evaluation region 80 can be formed using the production steps of producing the TFT 50 without needing an additional step.

Fourth Embodiment

In the first to third embodiments described above, the semiconductor film 1c for film quality evaluation is doped with the impurity so that it can be used for evaluation of the source/drain region of the TFT 50.

Figure 11:
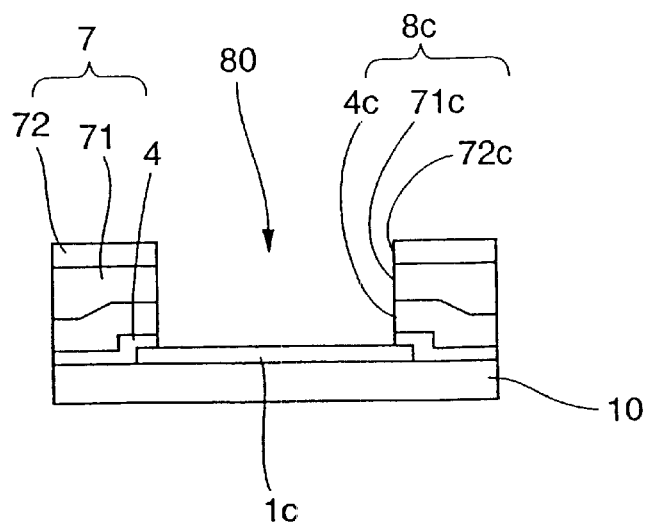
FIG. 11 is a cross-sectional view illustrating the construction of a film quality evaluation region for evaluating a channel region of a TFT, formed on an active matrix substrate according to a fourth embodiment of the present invention.

In the present embodiment, unlike the previous embodiments, the film quality evaluation region 80 is covered with the resist mask RM1, as shown in FIG. 9, during both steps shown in FIGS. 6(F) and 7(A) so that the semiconductor film 1c for film quality evaluation becomes an intrinsic region doped with no impurity, as shown in FIG. 11. Thus, by analyzing the semiconductor film 1c for film quality evaluation in the evaluation region 80, it is possible to evaluate the film quality of the channel region 1a of the TFT 50. Also in this case, the film quality evaluation region 80 can be formed using the production steps of producing the TFT 50 without needing an additional step.

In some cases, an extremely low concentration of impurity is doped into the channel of the TFT 50, during steps shown in FIGS. 6(A)–6(C). In this case, the semiconductor film 1c for film quality evaluation is doped with the same impurity at the same concentration as the channel region 1c.

Fifth Embodiment

Figure 12:
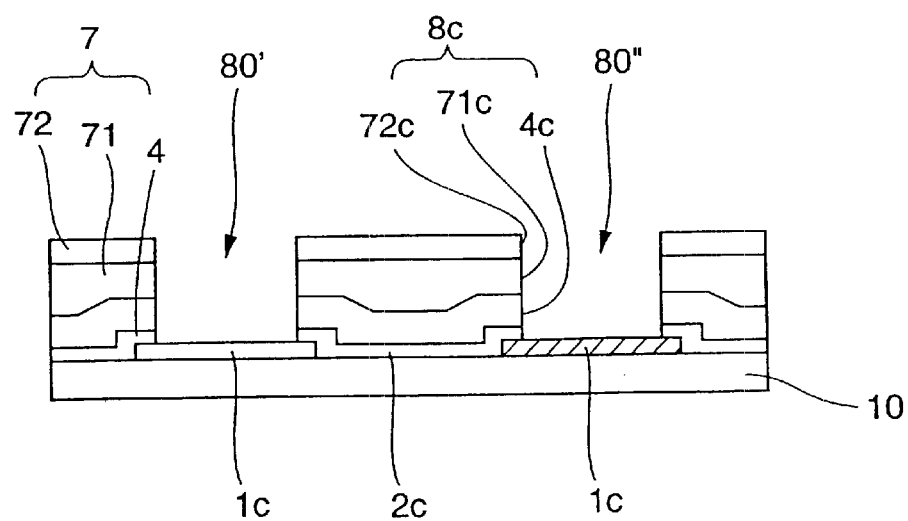
FIG. 12 is a cross-sectional view illustrating the construction of film quality evaluation regions formed at a plurality of locations on an active matrix substrate according to a fifth embodiment of the present invention.

In the first to fourth embodiments described above, the film quality evaluation region 80 is formed at one location for each active matrix substrate 200. However, the film quality evaluation region 80 may be formed at two or more locations as shown in FIG. 12. The same impurity may be doped to the same concentration into the semiconductor film 1c for film quality evaluation for all film quality evaluation regions 80. Alternatively, no impurity may be doped in the semiconductor film 1c for film quality evaluation in a certain film quality evaluation region so that it can be used to evaluate the film quality of the channel region 1a of the TFT 50, and an impurity may be doped in the semiconductor film 1c for film quality evaluation in another film quality evaluation region 80 so that it can be used to evaluate the film quality of the source/drain region of the TFT 50.

Sixth Embodiment

Now a sixth embodiment of the present invention is described below. An electrooptical device and a method of production thereof are basically similar to the first embodiment, and thus similar parts are denoted by similar reference numerals.

(Construction of Active Matrix Substrate)

Figure 13:
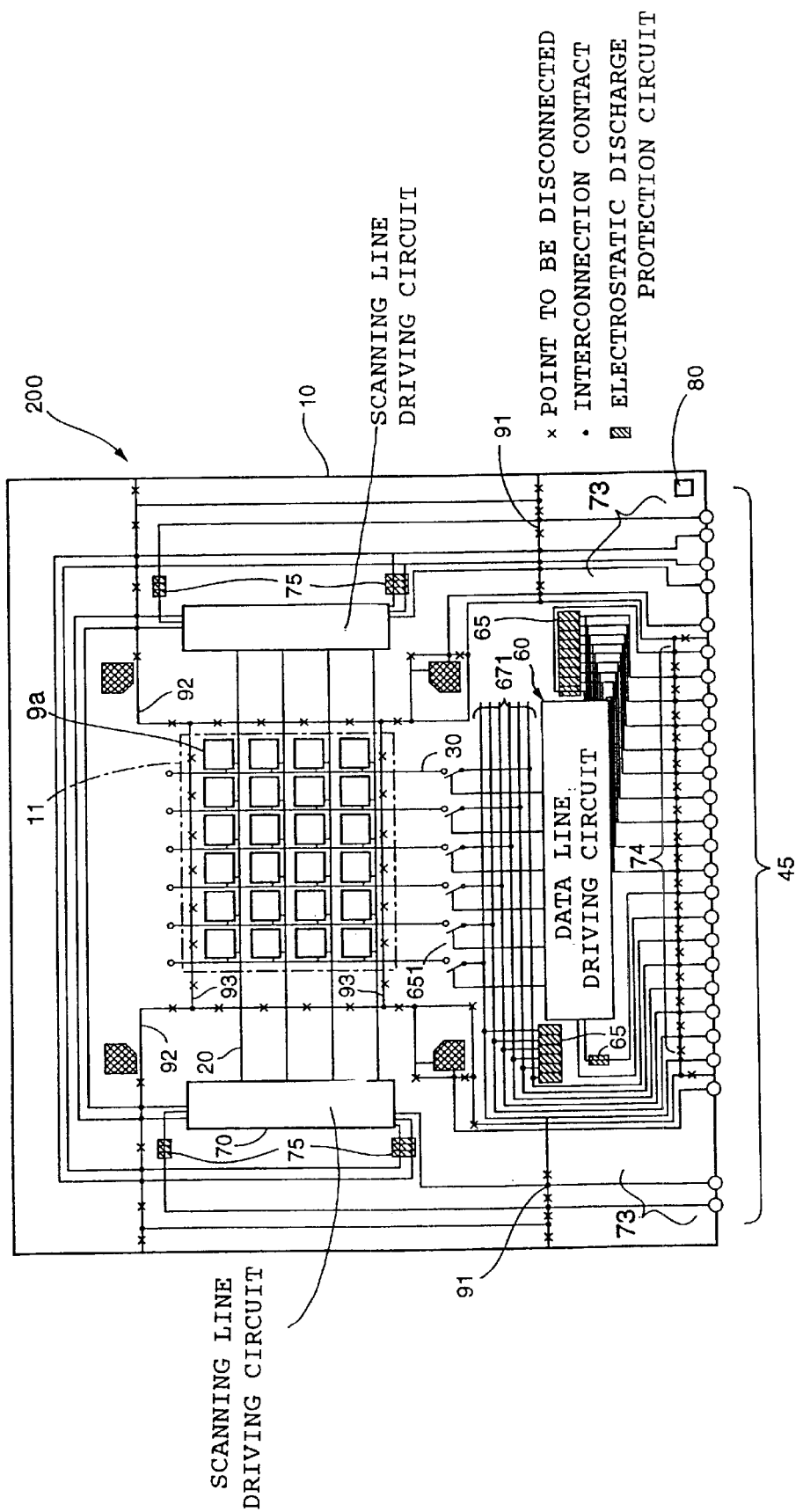
FIG. 13 is a block diagram of an active matrix substrate used in an electrooptical device according to an embodiment of the present invention.

FIG. 13 is a block diagram schematically illustrating the construction of an active matrix substrate used in an electrooptical device according to the sixth embodiment of the present invention.

Also in the active matrix substrate 200 including driving circuits disposed thereon, according to the present embodiment, as shown in FIG. 13, a TFT 50 is formed so as to be connected to a plurality of scanning lines 20 and a plurality of data lines 30 are disposed on an insulating substrate 10 such that they cross one another, and pixel electrodes 9a are disposed in the form of an array wherein each pixel electrode 9a is connected to one of scanning lines 20 and data lines 30. The scanning lines 20 are formed of a tantalum film, an aluminum film, or an aluminum alloy film. The data lines 30 are formed of an aluminum film or an aluminum alloy. The scanning lines 20 and the data lines 30 may be formed either in a single layer structure or a multilayer structure. The area in which the pixel electrodes 9a are disposed serves as an image display area 11.

In an area (peripheral area) outside the image display area 11, on the insulating substrate 10, there is disposed a data line driving circuit 60 for supplying an image signal to the respective data lines 30. A scanning line driving circuit 70 for supplying a scanning signal for selecting a pixel to the respective scanning lines 20 is disposed in both areas adjacent to ends of the scanning lines 20.

On the active matrix substrate 200 of the present embodiment, in an area on the same side of the insulating substrate 10 as that where the data line driving circuit 60 is formed, there are disposed a great number of input/output terminals 45 formed of a conductive film, such as an aluminum film or a similar metal film, a metal silicide film, or an ITO film, so that a constant power supply voltage, a modulated image signal (image signal), and other various driving signals are input via the input/output terminals 45. Signal lines 73 and 74 formed of a low-resistance metal film, such as an aluminum film for driving the scanning line driving circuit 60 and the data line driving circuit 70 extend from the respective input/output terminals.

Electrostatic discharge protection circuits 65 and 75 are formed at intermediate points of the respective signal lines 73 and 74, as will be described later.

The other parts are similar to those in the first embodiment described above with reference to FIG. 3, and thus corresponding parts are denoted by similar reference numerals and they are not described in further detail here.

(Structure of Pixel and TFT)

Figure 14:
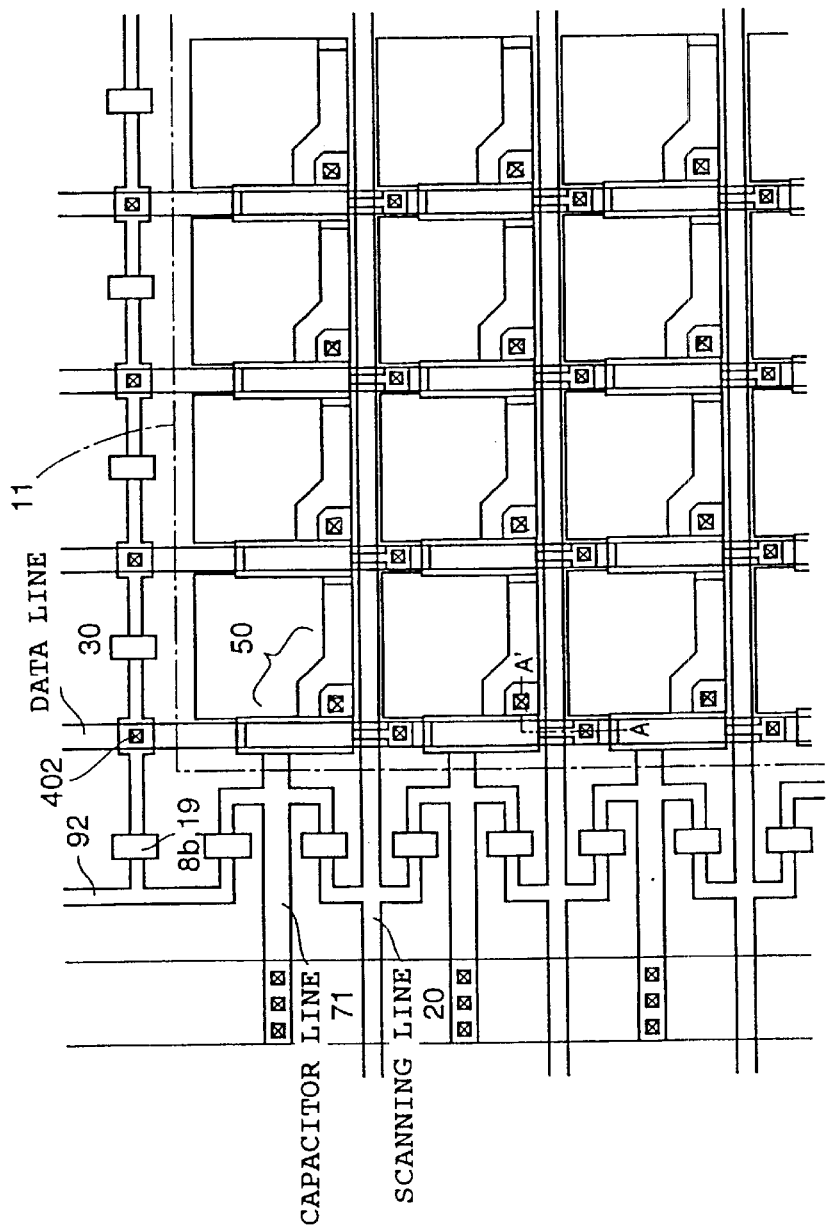
FIG. 14 is a plan view illustrating, in an enlarged fashion, a corner of an image display area of the active matrix substrate shown in FIG. 13.
Figure 15:
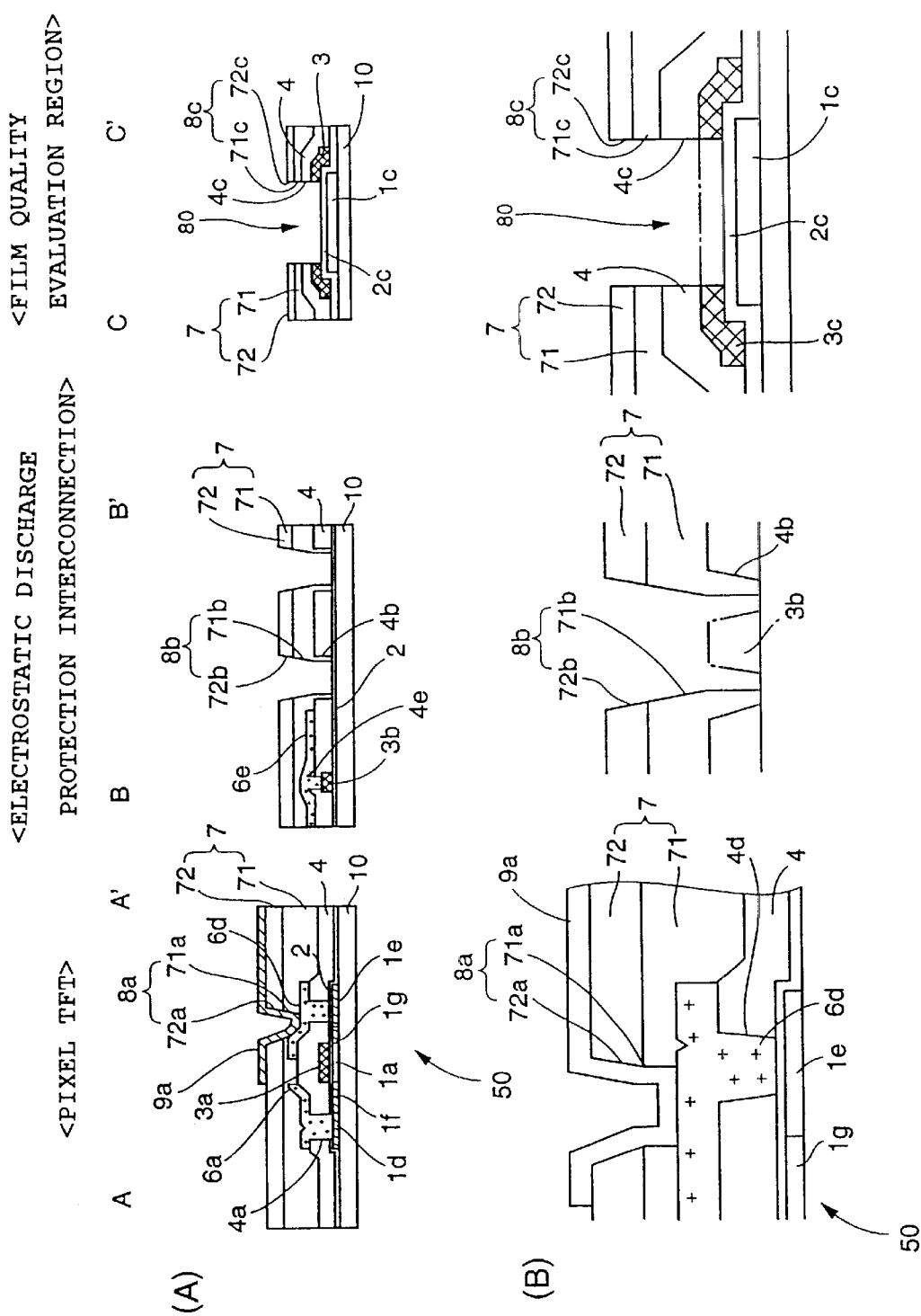
FIG. 15(A) illustrates a cross section of a pixel TFT shown in FIG. 14 of the active matrix substrate shown in FIG. 13 taken along line XIV–XIV' in FIG. 14, a cross section of an electrostatic discharge protection part shown in FIG. 16 taken line XVI–XVI', and a cross section of a film quality evaluation region shown in FIG. 1 taken line V–V', and FIG. 15(B) partly illustrates enlarged cross sections thereof.

FIG. 14 is a plan view illustrating, in an enlarged fashion, a corner of an image display area of the active matrix substrate shown in FIG. 13. FIG. 15(A) illustrates a cross section of a pixel TFT shown in FIG. 14 of the active matrix substrate shown in FIG. 13 taken along line XIV–XIV' in FIG. 14, a cross section of an electrostatic discharge protection part shown in FIG. 16 taken line XVI–XVI', and a cross section of a film quality evaluation region shown, which will be described later, taken line V–V'. FIG. 15(B) partly illustrates enlarged cross sections thereof.

As shown in FIG. 14, each pixel electrode 9a has a pixel switching TFT 50 connected to a scanning line 20 and a data line 30. There are also provided capacitance lines 75 extending toward the respective pixel electrodes 9a.

As shown in FIGS. 15(A) and 15(B), each TFT 50 includes a gate electrode 3a formed simultaneously with the scanning lines 20, source regions 1f and 1d electrically connected via a first contact hole 4a formed in a first interlayer insulating film 4 to a source electrode 6a which is a part of a data line 30, drain regions 1g and 1e electrically connected via a second contact hole 4d formed in the first interlayer insulating film 4 to a drain electrode 6d formed of an aluminum film, or the like, which is formed simultaneous with the data line 30. A second interlayer insulating film is formed in a layer above the first interlayer insulating film 4. A third contact hole 8a is formed in this second interlayer insulating film 7, and the pixel electrode 9a is electrically connected to the drain electrode 6d via the third contact hole.

(Protection from Electrostatic Discharge)

In the active matrix substrate 200 having the above-described structure, the TFT 50, the various interconnection lines, the scanning line driving circuit 70, and the data line scanning circuit 60 are formed using a semiconductor process. Because the active matrix substrate 200 includes the insulating substrate 10 which can cause a malfunction due to electrostatic discharge, the active matrix substrate 200 of the present embodiment is protected from electrostatic discharge as described below.

In the present embodiment, as shown in FIG. 13, in the processing step of forming the scanning lines 20 and the gate electrodes of the TFTs 50 are formed, a first short-circuit line 91 electrically connected to all signal lines 73 and 74 is also formed. Similarly, in the processing step of forming the scanning lines 20 and the gate electrodes of the TFTs 50, a second short-circuit line 92 electrically connected to all scanning lines 20 is also formed. Furthermore, in the processing step of forming the scanning lines 20 and the gate electrodes of the TFTs 50, a third short-circuit line 93 electrically connected to all data lines 30 is also formed.

Herein, the first, second and third short-circuit lines 91, 92, and 93 are formed of a tantalum film simultaneously with the scanning lines 20 and the gate electrodes of the TFTs 50 in a layer between the gate insulating film 2 and the first interlayer insulating film 4. On the other hand, the signal lines 73 and 74 and the data lines 30 are formed of an aluminum film in a layer between the first interlayer insulating film 4 and the second interlayer insulating film 7. Thus, the first and third short-circuit lines 91 and 93 are located in the layer different from the layer in which the signal lines 73 and 74 and the data lines 30 are formed of aluminum.

Figure 16:
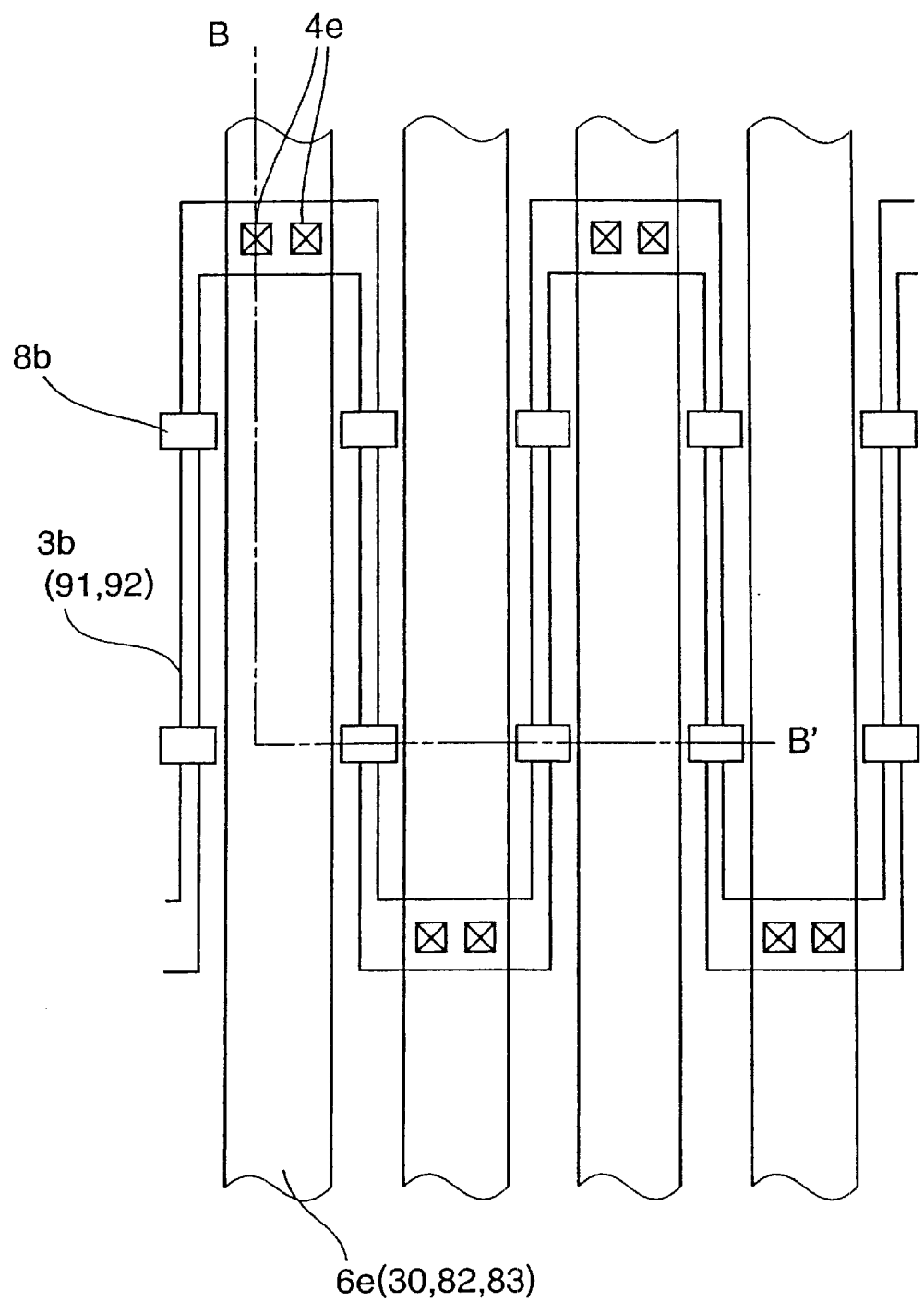
FIG. 16 is a plan view illustrating a connection structure used to connect a signal line and a short-circuit line to each other on the active matrix substrate shown in FIG. 13.

Therefore, as shown in FIGS. 16 and 15(A), the first and third short-circuit lines 91 and 93 are electrically connected to the lines 6e (the signal lines 73 and 74 and the data lines 30) via contact holes 4e formed in the first interlayer insulating film 4.

If the first, second and third short-circuit lines 91, 92, and 93 are connected to the signal lines 73 and 74, the scanning lines 20, and the data lines 30, when an electrostatic charge is generated during processing steps performed after forming these short-circuit lines, the electrostatic charge is diffused to a peripheral area of the substrate via the first, second and third short-circuit lines 91, 92, and 93 and thus a spike of an excess current does not flow through the scanning lines 20, the image display area 11, the scanning line driving circuit 70, the sample-and-hold circuit, and the data line driving circuit 60. Thus, these circuit elements are all protected from electrostatic discharge.

The first, second, and third short-circuit lines 91, 92, and 93 become unnecessary after completion of producing the active matrix substrate 200. Therefore, as will be described in detail later, cut-off holes 8b are formed, as shown in FIGS. 15(A) and 15(B), in the first interlayer insulating film 4 and the second interlayer insulating film 7 at locations denoted by x in FIG. 13 and the short-circuit lines 3b (the first, second, and third short-circuit lines 91, 92, and 93) are cut off by mean of etching via the cut-off holes 8b. That is, in FIG. 13, the first, second, and third shortcircuit lines 91, 92, and 93 are connected to the signal lines 73 and 74, the scanning lines 20, and the data lines 30, respectively, until a particular production step. However, after etching via the cut-off holes is performed, the signal lines 73 and 74, the scanning lines 20, and the data lines 30 are electrically isolated from one another. Therefore, in this active matrix substrate 200, once the first, second, and third short-circuit lines 91, 92, and 93 are cut off, no problems occur in evaluation of electrical characteristics and in operation of a completed liquid crystal display device.

The short-circuit lines 3b (the first, second, and third short-circuit lines 91, 92, and 93) are cut off after exposing them via holes formed in the first interlayer insulating film 4 and the second interlayer insulating film 7. To this end, a cut-off hole 4b (first connection hole) is formed in the first interlayer insulating film 4, at a location corresponding to the short-circuit line 3b, and a cut-off hole 8b (second cut-off hole) is formed in the second interlayer insulating film 7, at a location corresponding to the short-circuit line 3b. The cut-off hole 8b has a diameter greater than the cut-off hole 4b and is formed at a location overlapping the cut-off hole 4b.

(Electrostatic Discharge Protection Circuit)

Figure 17:
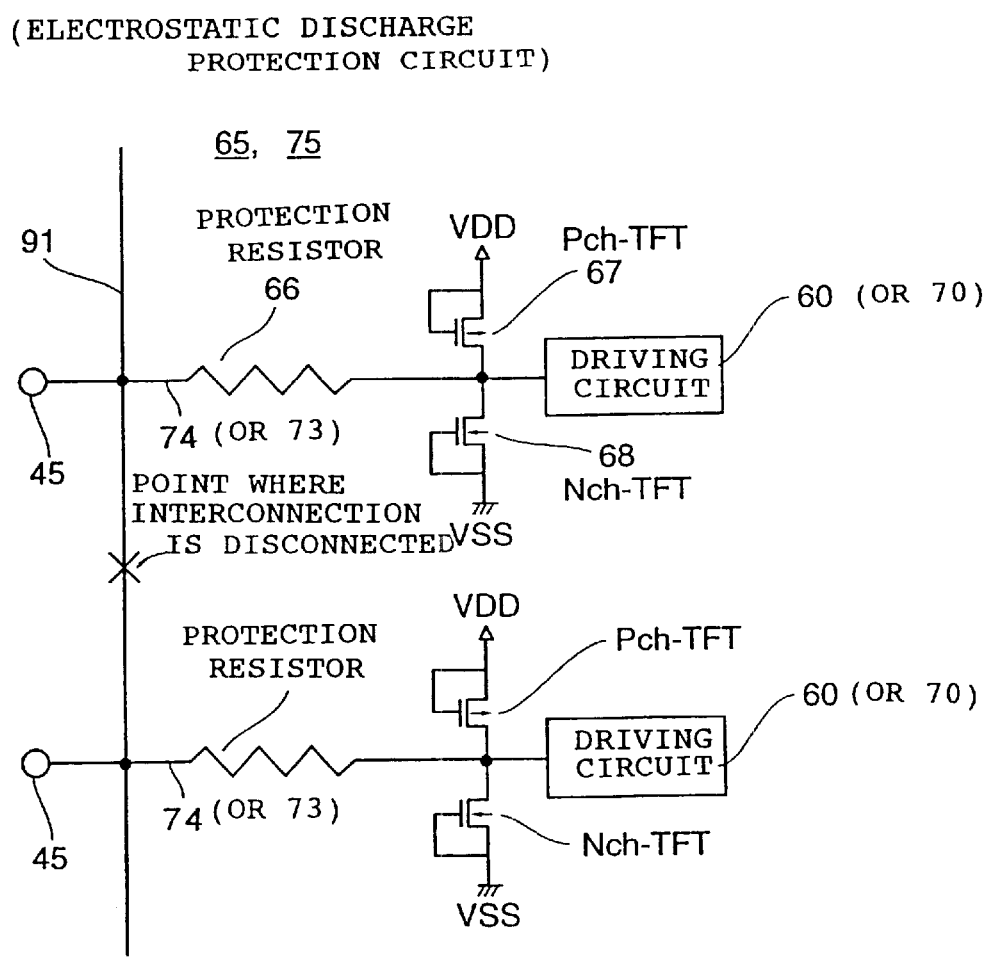
FIG. 17 is a circuit diagram of an electrostatic discharge protection circuit formed on the active matrix substrate shown in FIG. 13.

The electrostatic discharge protection circuits 65 and 75 shown in FIG. 13 may be realized using various circuit techniques. In a specific example shown in FIG. 17, a protection resistor 66, a p-channel TFT 67, and an n-channel TFT 68 are used wherein the two TFTs 67 and 68 are connected in a push-pull configuration so as to serve as diodes connected to a positive power supply voltage VDD and a negative power supply voltage VSS, respectively. In the present embodiment, the first short-circuit line 91 is connected to the signal line 73 (or 74) at a node between an input/output terminal 45 and a protection resistor 66 so that an electrostatic surge entering via the input/output terminal 45 or the first short-circuit line 91 cannot reach the data line driving circuit 60 and the scanning line driving circuit 70 through a path other than through the protection resistor 66 and the electrostatic discharge protection circuit 65 (or 75). This ensures that electrostatic surges are absorbed by the electrostatic discharge protection circuit 65 (or 75) and thus the data line driving circuit 60 and the scanning line driving circuit 70 are protected from electrostatic surges.

(Film Quality Evaluation Region)

In the active matrix substrate 200 described above, when the respective elements have been formed using a semiconductor process, the first, second, and third short-circuit lines 91, 92, and 93 are cut off at locations denoted by x in FIG. 13, and then electrical characteristics are tested. If the active matrix substrate fails this test, various analyses are performed and the result is fed back. For example, the impurity distribution at the interface between the gate insulating film 2 and the channel region 1a of the TFT 50 is evaluated, and the result is fed back.

Also in the present embodiment, to perform such an evaluation, the active matrix substrate 200 has a film quality evaluation region 80 with a rectangular shape and a size of about 1 mm square, wherein it is formed, as shown in FIGS. 1 and 13, in a substrate's corner (the lower right corner in FIGS. 1 and 13) where no elements, such as the image display area 11, the scanning line driving circuit 70, the data line driving circuit 60, and the signal lines 73 and 74, are formed.

In this film quality evaluation region 80, as shown in FIGS. 15(A) and 15(B), a semiconductor film 1c (silicon film) for film quality evaluation and a gate insulating film 2c (gate insulating film/silicon oxide film for film quality evaluation) are formed in a multilayer structure using the same layers as the channel region 1a and the gate insulating film 2, respectively, of the TFT 50. The gate insulating film 2c in the evaluation region is exposed via an opening 8a (openings 4c, 71c, and 71c) formed through the respective interlayer insulating films 4, 71, and 72 formed in the film quality evaluation region. A residual part of the conductive film 3c remains around the perimeter of the opening 8c after being etched through the opening 8c, as will be described later. The semiconductor film 1c for film quality evaluation is formed over an area considerably greater than the channel region 1a. Furthermore, the area of the semiconductor film 1c for film quality evaluation is also greater than the area of the opening 8c and is formed in a region containing a region where the opening 8c is formed.

In this active matrix substrate 200 of the present embodiment, because the semiconductor film 1c for film quality evaluation and the gate insulating film 2c in the evaluation region are formed in the film quality evaluation region 80 using the same layers as the channel region 1a and the gate insulating film 2, respectively, of the TFT 50, film quality, such as an impurity distribution at the interface between the gate insulating film 2 and the channel region 1a of the TFT 50, can be evaluated by evaluating the film quality evaluation region 80. In the evaluation using the film quality evaluation region 80, unlike the evaluation performed directly upon the TFT 50, it is possible to immediately start the evaluation without having to remove the interlayer insulating films 4, 71, and 72 and the gate electrode 3a, because the film quality region 80 is exposed through the opening 8c formed through the interlayer insulating films 4, 71, and 72. This makes it possible to easily evaluate the film quality in a short time. The film quality evaluation region 80 can be formed over a large area without influencing the characteristics of the TFT 50. The large film quality evaluation region makes it possible to perform high-accuracy elemental analysis in a depth direction by way of SIMS while lustering a part of the film quality evaluation region 80. The area of the film quality evaluation region 80 is also greater than the channel region of the transistor. More specifically, the area is as large as about 1 mm$^2$. Therefore, in addition to elemental analysis by way of SIMS, it is also possible to evaluate crystallinity of the semiconductor film 1c for film quality evaluation (channel region 1a) by way of Raman scattering, or the like. Thus, the film quality evaluation region 80 is very useful for evaluating the TFT 50 formed of a polycrystal semiconductor film obtained by crystallizing an amorphous semiconductor film.

As can be seen from FIG. 1, the film quality evaluation region 80 of the present embodiment is formed in the part, extending beyond the end of the opposite substrate 100, of the active matrix substrate 200. This allows film quality evaluations to be performed at various production stages in addition to a stage after completion of producing the active matrix substrate 200. For example, after testing the operation of an electrooptical device 300 obtained by assembling the active matrix substrate 200 with an opposite substrate 100, the film quality can be evaluated using the film quality evaluation region 80.

(Method of Producing the Active Matrix Substrate 200)

Figure 18:
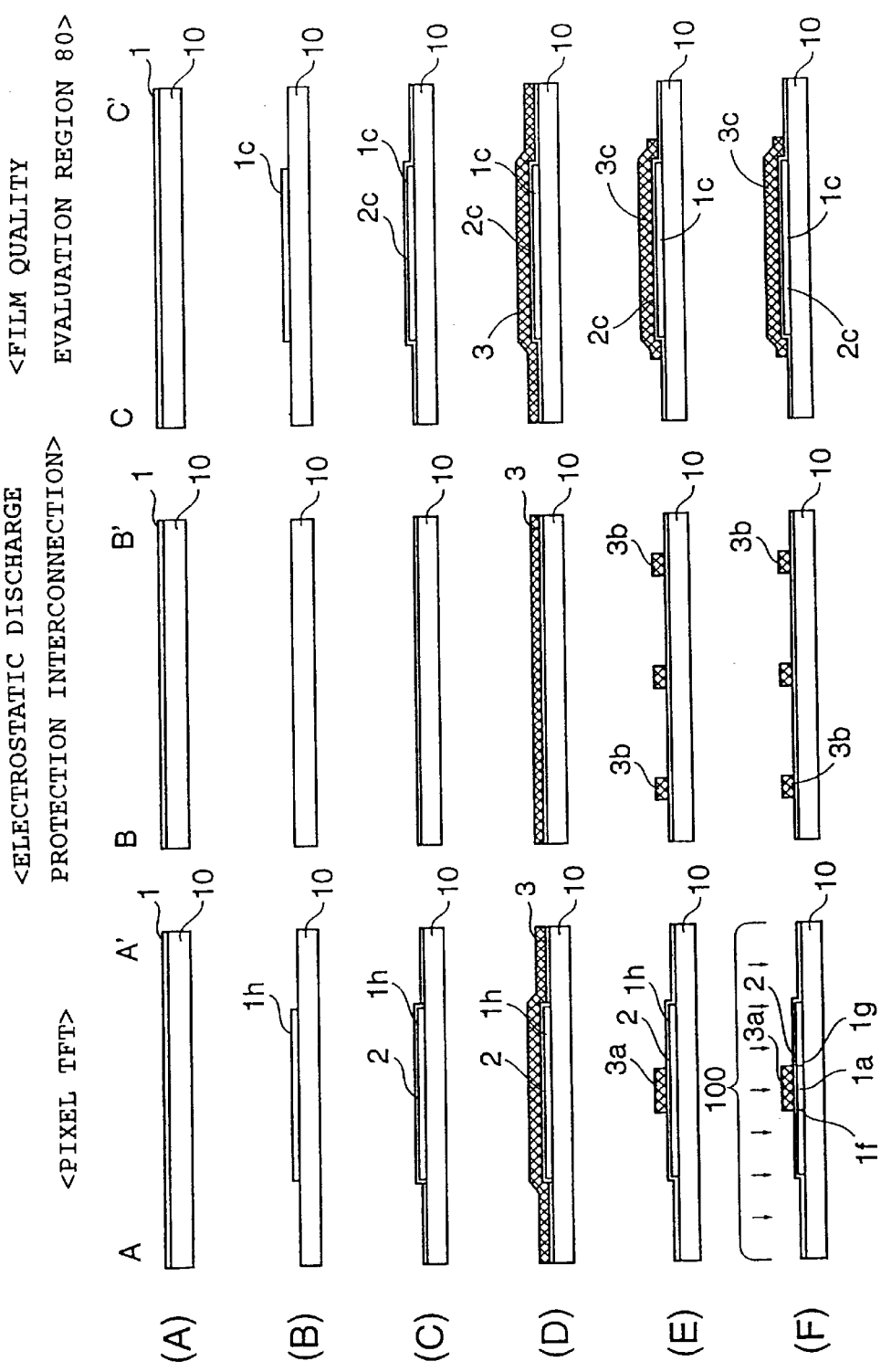
FIGS. 18(A)–18(F) are cross-sectional views illustrating production steps of the active matrix substrate shown in FIG. 13.
Figure 19:
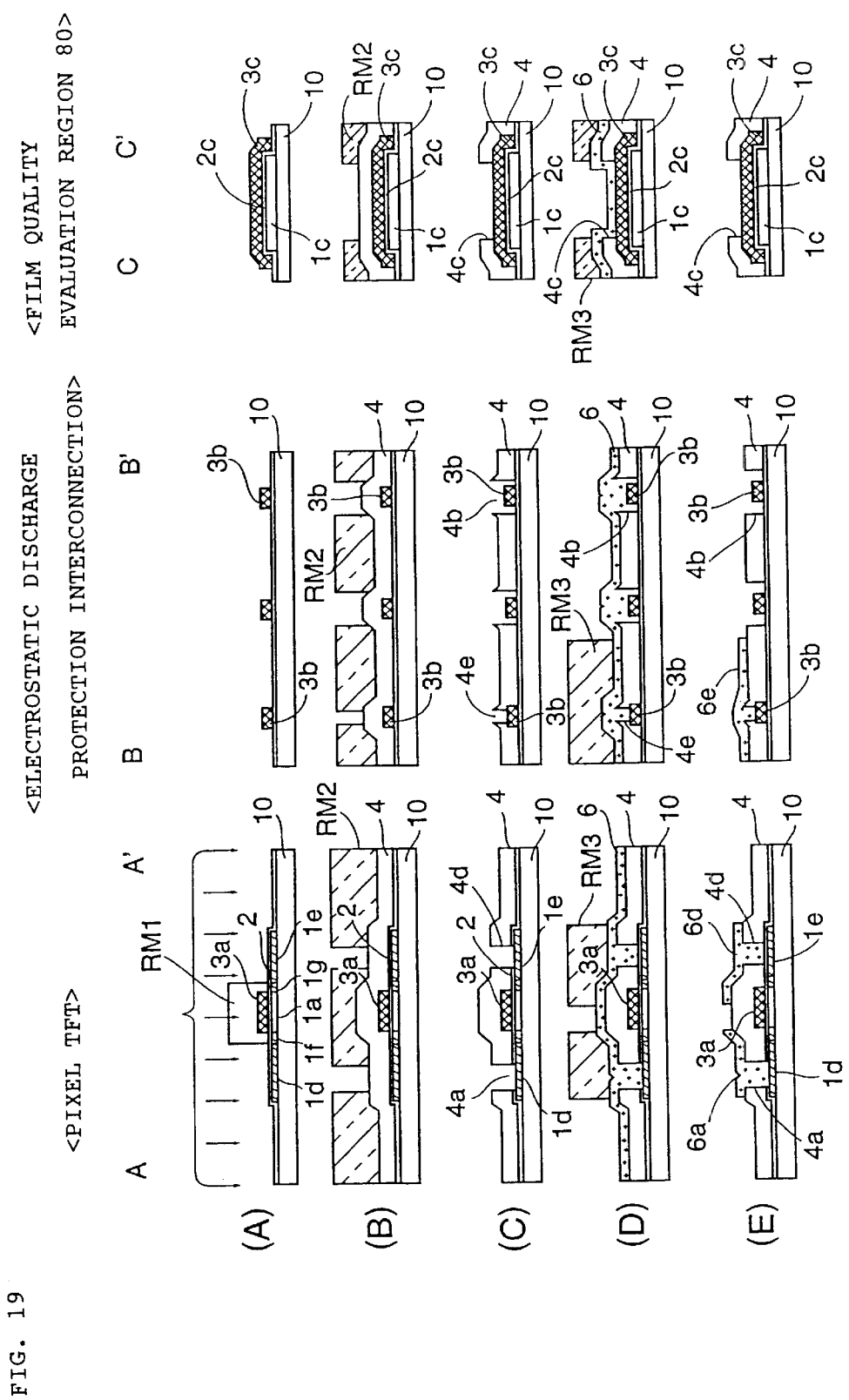
FIGS. 19(A)–19(E) are cross-sectional views illustrating production steps following those shown in FIGS. 18(A)–18(F)
Figure 20:
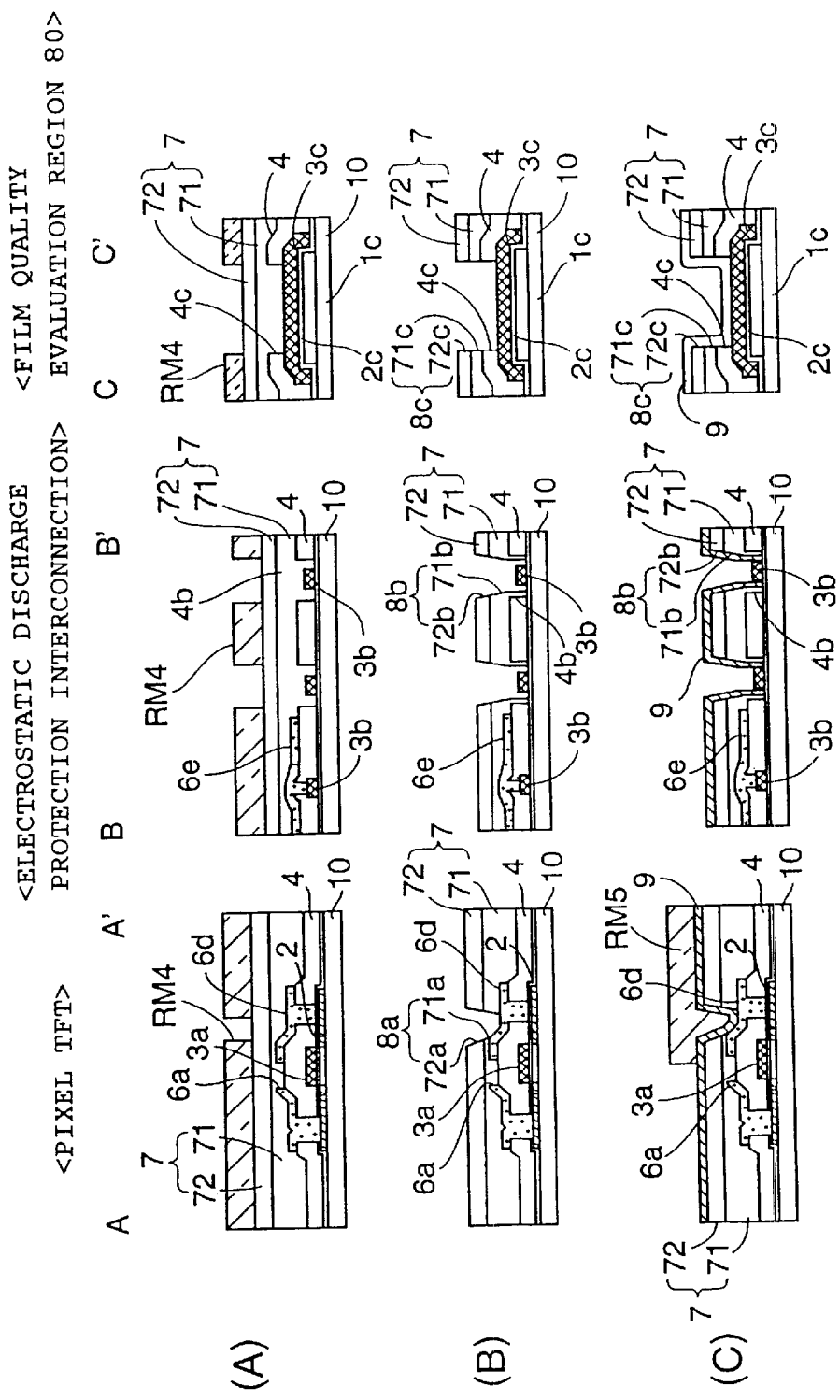
FIGS. 20(A)–20(C) are cross-sectional views illustrating production steps following those shown in FIGS. 19(A)–19(E)
Figure 21:
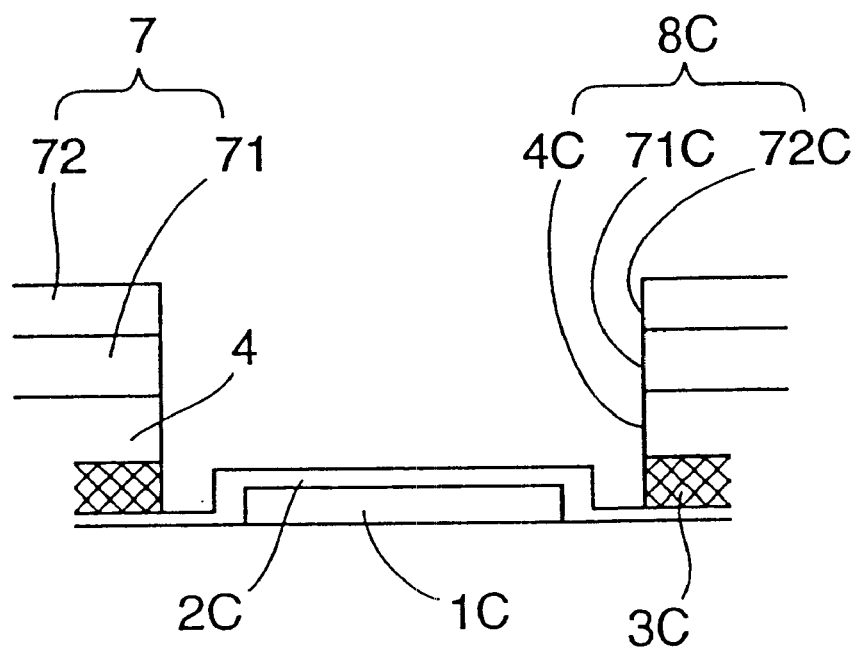
FIG. 21 is a cross-sectional view illustrating the construction of another film quality evaluation region formed on an active matrix substrate according to the present invention.

A method of producing the active matrix substrate 200 and simultaneously forming the film quality evaluation region 80 while providing protection against electrostatic discharge is described below in reference with FIGS. 18 to 20 which are cross-sectional views illustrating production steps of the active matrix substrate 200 according to the present embodiment. In these figures, cross sections (of a pixel TFT region) taken along line XIV–XIV' of FIG. 14 are shown on the left side, cross sections (of an electrostatic discharge protection line, denoted by hatched lines in FIG. 13, region where a short circuit line is cut off) taken along line XVI–XVI' of FIG. 16 are shown in the center, and cross sections (of the film quality evaluation region 80) taken along line V–V' of FIG. 1 are shown on the right side.

The production steps described herein are similar to those described above with reference to FIGS. 6 to 8, and thus similar parts are denoted by similar reference numerals, and they are not described in further detail herein.

First, as shown in FIG. 18(A), a semiconductor film 1 of polysilicon with a thickness of about 20 nm to 200 nm and more preferably of about 100 nm is formed by way of for example low pressure CVD either directly on a transparent insulating substrate 10 made of glass, such as alkali-free glass or quartz or indirectly via an underlying protective film (not shown) formed on the insulating substrate 10, over the entire surface thereof. Thereafter, the semiconductor film 1 is patterned using a photolithography technique so as to form an island of a semiconductor film 1 h (active layer) in a pixel TFT region, as shown in FIG. 18(B). Simultaneously therewith, an island of semiconductor film IC for film quality evaluation is formed in a film quality evaluation region 80. On the other hand, in regions where electrostatic discharge protection lines are to be formed, the semiconductor film 1 is completely removed.

The formation of the semiconductor film 1 may be accomplished by first depositing an amorphous silicon film using a low-temperature process and then crystallizing it by way of laser annealing, or the like, thereby forming a polysilicon film.

Then, as shown in FIG. 18(C), a silicon oxide film with a thickness of about 50 nm to 150 nm is formed by way of CVD, or the like, over the entire area of the insulating substrate 10 at a temperature of, for example, 400° C. Thus, in the pixel TFT region, the surface of the island-shaped semiconductor film 1h is covered with a gate insulating film 2. In the film quality evaluation region 80, on the other hand, a gate insulating film 2c in the evaluation region is formed on the surface of the island-shaped semiconductor film 1c for film quality evaluation.

Then, as shown in FIG. 18(D), a tantalum film 3, which will be used later to form a gate electrode and other elements, is formed on the entire area of the insulating substrate 10. The tantalum film 3 is then patterned using a photolithography process so as to form a gate electrode 3a in the pixel TFT region, as shown in FIG. 18(E). In the film quality evaluation regions 80, the conductive film 3c is left therein. On the other hand, in the electrostatic discharge protection line region, the tantalum film is left so as to serve as the short-circuit lines 3b (the first, second, and third short-circuit lines 91, 92, and 93).

Thereafter, as shown in FIG. 18(F), in the pixel TFT regions and the n-channel TFT regions of the driving circuits, impurity ions (phosphorus ions) are implanted using the gate electrode 3a as a mask to a low dose of about $0.1 \times 10^{13}/cm^2$ to $0.1 \times 10^{13}/cm^2$ so as to form a lightly doped source region 1f and a lightly doped drain region 1g both selfaligned relative to the gate electrode 3a in each pixel TFT region. In this process, the region just below the gate electrode 3a is not doped with the impurity ions and thus this region becomes a channel region 1a. In this processing step, as the channel region 1a, the semiconductor film 1c for film quality evaluation in the film quality evaluation region 80 is covered with the conductive film 3c, and thus no impurity is introduced.

Then, in the pixel TFT regions, as shown in FIG. 19(A), impurity ions (phosphorus ions) are heavily doped using a resist mask RM1 with a width greater than the width of the gate electrode 3a to a dose of about $0.1 \times 10^{15}/cm^2$ to $10 \times 15^{115}/cm^2$ thereby forming a heavily doped source region 1d and a heavily doped drain region 1e. Also in this processing step, as the channel region 1a, the semiconductor film 1c for film quality evaluation in the film quality evaluation region 80 is covered with the conductive film 3c, and thus no impurity is introduced.

Thereafter, as shown in FIG. 19(B), a first interlayer insulating film 4 with a thickness of about 300 nm to 1500 nm of silicon oxide or NSG (silicate glass containing neither boron nor phosphorus) is formed in a layer on the gate electrode 3a, the short-circuit lines 3b, and the conductive film 3c, using a CVD process, or the like, at a temperature of about 400° C.

A resist mask RM2 is then formed which will be used to form contact holes, cut-off holes, and openings in the first interlayer insulating film 4 by way of a photolithography process.

Thereafter, as shown in FIG. 19(C), in the pixel TFT region, contact holes 4a and 4d are formed in the first interlayer insulating film 4, at locations corresponding to parts of the source region 1d and the drain region 1e, respectively. On the other hand, in the electrostatic discharge protection circuit region, a contact hole 4e and a cut-off hole 4b are formed in the first interlayer insulating film 4, at locations corresponding to parts of the short-circuit lines 3b. In the film quality evaluation region 80, an opening 4c is formed in the first interlayer insulating film 4, at a location corresponding to a part of the conductive film 3c. Thus, in the electrostatic discharge protection circuit region, the predetermined parts, which will be cut off later, of the short-circuit lines 3b are exposed. On the other hand, in the film quality evaluation region 80, the conductive film 3c is exposed. The resist mask RM2 is then removed.

Thereafter, as shown in FIG. 19(D), an aluminum film 6 used to form the source electrodes and other elements is formed by way of sputtering, or the like, in a layer on the surface of the first interlayer insulating film 4.

A resist mask RM3 is then formed which will be used to pattern the aluminum film 6 by way of a photolithography process.

Thereafter, as shown in FIG. 19(E), the aluminum film 6 is patterned so as to form, in each pixel TFT region, an aluminum source electrode 6a which is a part of data line 30 and which is electrically connected to the source region la via the first contact hole 4a, and also form a drain electrode 6d electrically connected to the drain region 1e via the second contact hole 4d . In the electrostatic discharge protection line region, various lines 6e (the data lines 30 and the signal lines 73 and 74) formed of the aluminum film are electrically connected to the short-circuit line 3b via the contact holes 4e. On the other hand, in the film quality evaluation region 80, the aluminum film 6 is completely removed.

Thus, in steps shown in FIGS. 19(C)–19(E), the first and third short-circuit lines 91 and 93 descried above with reference to FIG. 16 are connected to the signal lines 73 and 74 and the data lines 30. On the other hand, in the electrostatic discharge protection line region, parts, which will be cut off later, of the short circuit line 3b are exposed. The resist mask RM3 is then removed.

Thereafter, as shown in FIG. 20(A), an insulating film 71 is formed in a layer on the source electrode 6a and the interconnection line 6e, by coating and then baking perhydropolysilazane or a composition containing perhydropolysilazane. Furthermore, an insulating film 72 of silicon oxide with a thickness of about 50 nm to 1500 nm is formed on the surface of the insulating film 71, by way of a CVD process using TEOS at a temperature of, for example, about 400° C. These insulating films 71 and 72 form a second interlayer insulating film 7.

A resist mask RM4 is then formed which will be used to form contact holes, cut-off holes, and openings in the second interlayer insulating film 7 by way of a photolithography process.

Thereafter, as shown in FIG. 20(B), contact holes 71a and 72a are formed in the insulating films 71 and 72, respectively, of the second interlayer insulating film 7, at a location corresponding to the drain electrode 6d, wherein the contact holes 71a and 72a form a third contact hole 8a.

In this step, in the electrostatic discharge protection line region, cut-off holes 8b including cut-off holes 71b and 72b are formed in the insulating films 71 and 72 forming the second interlayer insulating film 7, at locations where the short-circuit lines 3b (first, second, and third short-circuit lines 91, 92, and 93) so that portions, which will be cut off later, of the short-circuit lines 3b are exposed.

On the other hand, openings 71c and 72c are formed in the insulating films 71 and 72, respectively, of the second interlayer insulating film 7 in the film quality evaluation region 80 thereby forming an opening 8c through which the conductive film 3c is exposed. The resist mask RM4 is then removed.

Thereafter, as shown in FIG. 20(C), an ITO film 9 with a thickness of about 40 nm to 200 nm, which will be used to form a drain electrode, is formed in a layer on the surface of the second interlayer insulating film 7 by way of sputtering, or the like.

A resist mask RM5 is then formed which will be used to pattern the ITO film 9 by way of a photolithography process.

The ITO film 9 is patterned using the resist mask RM5. Thus, as shown in FIGS. 15(A) and 15(B), a pixel electrode 9a electrically connected to the drain electrode 6d via the third contact hole 8a is formed in each pixel TFT region. In the electrostatic discharge protection line region, the ITO film 9 is completely removed. Also in the film quality evaluation region 80, the ITO film 9 is completely removed.

In the present embodiment, when the ITO film 9 is patterned, the parts, which should be cut off, of the short-circuit lines 3b in the electrostatic discharge protection line region are cut off thereby isolating the respective lines from one another. Because the short-circuit lines 3b are cut off in the final production step, the short-circuit lines 3b provide effective protection against electrostatic charges which may appear during various steps before the final step. That is, the production steps are performed while maintaining the signal lines 73 and 74 (lines 6e) in a short-circuited state via the first short-circuit line 91 (short-circuit line 3b). Thus, even if an electrostatic charge is generated or a charge is accumulated on the surface of the insulating substrate, the charge is diffused to the peripheral area of the substrate via the first short-circuit line 91, and thus a surge of excess current is prevented from flowing through the data line driving circuit 60 and the scanning line driving circuit 70. Thus, the data line driving circuit 60 and the scanning line driving circuit 70 are protected. Similarly, the scanning lines 20 are electrically connected to the second short-circuit line 92 (short-circuit line 3b) thereby preventing a surge of excess current from flowing through the scanning lines 20 and thus protecting the scanning lines 20 and the image display area 11. Furthermore, the data lines 30 (lines 6e) are electrically connected to the third short-circuit line 93 (short-circuit line 3b) thereby preventing a surge of excess current from flowing through the data lines 30 and thus protecting the scanning lines 30, the sample-and-hold circuit, and the image display area 11.

In the film quality evaluation region 80, the conductive film 3c exposed through the opening 8c is removed, and thus the gate insulating film 2c in the evaluation region becomes exposed through the opening 8c. Thus, thereafter, it is possible to immediately start evaluation of the film quality of the gate insulating film 2c in the evaluation region and the semiconductor film 1c for film quality evaluation. Because the gate insulating film 2c in the evaluation region and the semiconductor film 1c for film quality evaluation have substantially the same process histories as the gate insulating film 2c and the channel region 1a, respectively, of the TFT 50, the film quality of the gate insulating film 2 and the channel region of the TFT 50 can be accurately evaluated by analyzing the gate insulating film 2c in the evaluation region and the semiconductor film 1h for film quality evaluation.

Furthermore, the film quality evaluation region 80 can be exposed using the production step of cutting off the short-circuit lines 6b for electrostatic discharge protection without needing an additional step. In electrostatic discharge protection, the short-circuit lines 3b are formed simultaneously with the scanning lines 20, or the like, the cut-off holes 4b are formed simultaneously when the first and second contact holes 4a and 4d are formed in the first interlayer insulating film 4, and the cut-off holes 8b are formed simultaneously when the third contact holes 8a are formed in the second interlayer insulating film 7. Therefore, when the pixel electrodes 9a are electrically connected to the corresponding drain regions 1e via the drain electrodes 6d, the short-circuit lines 3b are exposed through the first interlayer insulating film 4 and the second interlayer insulating film 7 and cut off during the steps of producing the TFTs. Thus, electrostatic discharge protection can be achieved without needing an additional step.

In the embodiments described above, the semiconductor film 1c for film quality evaluation is formed in the area containing the area where the opening 8c is formed. Alternatively, the semiconductor film 1c for film quality evaluation may be formed within the area where the opening 8c is formed.

Other Embodiment

In the embodiments described above, the film quality evaluation region is formed so as to be used to evaluate either a semiconductor film or a semiconductor film/gate insulating film. Alternatively, a structure disclosed in one of the first to fifth embodiments and the structure disclosed in the sixth embodiment may be combined together so as to form two types of film quality evaluation regions on the same single active matrix substrate. This can be achieved by simply combining the production steps described with reference to FIGS. 18 to 20 with the production steps described with reference to FIGS. 6 to 8, and thus no additional production step is required.

In the embodiments described above, the invention is applied to an active matrix substrate for use in an electrooptical device. The present invention may also be applied to a test substrate which is produced to check processing conditions when an active matrix substrate is produced.

The present invention is not limited to the specific embodiments described above. Various modifications and changes are possible without departing from the scope of the invention. For example, in addition to various types of liquid crystal displays described above, the present invention may also be applied to an electroluminescence display and a plasma display. Furthermore, the present invention may also be applied to an SOI (silicon on insulator) substrate and an SOS (silicon on sapphire) substrate.

What is claimed is:

1. An active matrix substrate, comprising:
   a transistor and a signal line both formed on a substrate;
   a film quality evaluation region including a semiconductor film for film quality evaluation, the semiconductor film for film quality evaluation being formed of the same layer as a semiconductor film used to form the transistor wherein the film quality evaluation region is in an interlayer insulating film, wherein the film quality evaluation region is disposed at one or more locations on the substrate at which neither the transistor nor the signal line is formed, the film quality evaluation region being exposed through an opening formed in the interlayer insulating film.

2. The active matrix substrate according to claim 1, wherein the interlayer insulating film in the evaluation region is formed of the same layer as as interlayer insulating film formed above the transistor.

3. The active matrix substrate according to claim 2, the semiconductor film for film quality evaluation being formed in a region including a region where an opening is formed.

4. The active matrix substrate according to claim 2, the semiconductor film for film quality evaluation being formed inside an opening.

5. The active matrix substrate according to claim 1, the semiconductor film for film quality evaluation being formed of the same layer as a source/drain region of the transistor and doped with the same impurity at the same concentration as the source/drain region.

6. The active matrix substrate according to claim 5, the film quality evaluation region having a greater area than the source/drain region of the transistor.

7. The active matrix substrate according to claim 1, the semiconductor film for film quality evaluation being formed of the same layer as a channel region of the transistor, the semiconductor film for film quality evaluation and the channel region being either intrinsic or channel-doped with the same impurity at the same concentration.

8. The active matrix substrate according to claim 7, the film quality evaluation region having a greater area than the source/drain region of the transistor.

9. The active matrix substrate according to claim 1, the semiconductor film for film quality evaluation being formed of the same layer as a channel region of the transistor, the semiconductor film for film quality evaluation and the channel region being either intrinsic or channel-doped with the same impurity at the same concentration, and the film quality evaluation region further including a gate insulating film for film quality evaluation formed of the same layer as a layer used to form a gate insulating film of the transistor.

10. The active matrix substrate according toy claim 9, the gate insulating film for film quality evaluation being exposed through an opening formed in an insulating film in the evaluation region, the insulating film in the evaluation region being formed of the same layer as a layer used to form an interlayer insulating film above the transistor.

11. The active matrix substrate according to claim 1, the film quality evaluation region having an area equal to or greater than 1 mm$^2$.

12. The active matrix substrate according to claim 1, the transistor being a thin film transistor, and disposed on the active matrix substrate are an image display area in which a scanning line electrically connected to a gate electrode of the thin film transistor, a data line electrically connected to a source region of the thin film transistor, and a pixel electrode connected to a drain region of the thin film transistor, are formed, a scanning line driving circuit and a data line driving circuit both located outside the image display area, for supplying a signal to the scanning line and the data line, respectively, and a plurality of signal lines for supplying the driving circuits, the film quality evaluation region being formed at one or more locations on the substrate at which neither the image display area, the scanning line driving circuit, the data line driving circuit, nor the signal line, is formed.

13. An electrooptical device, comprising:
    the active matrix substrate according to claim 12, an opposite substrate, and an electrooptical material being disposed between the active matrix substrate and the opposite substrate.

14. An active matrix substrate, comprising:
    a transistor and a signal line both formed on a substrate;
    a film quality evaluation region including a semiconductor film for film quality evaluation, the semiconductor film for film quality evaluation being formed of the same layer as a semiconductor film used to form the transistor, the film quality evaluation region being disposed at one or more locations on the substrate at which neither the transistor nor the signal line is formed; and
    a source/drain region of the transistor comprising a lightly doped source/drain region and a heavily doped source/drain region, and the semiconductor film for film quality evaluation is formed of the same layer as one of the lightly doped source/drain region and the heavily doped source drain region, and the semiconductor film for film quality evaluation is doped with the same impurity at the same concentration as the one of the lightly doped source/drain region and the heavily doped source/drain region.

15. An active matrix substrate, comprising:
    a transistor and a signal line both formed on a substrate;
    a film quality evaluation region including a semiconductor film for film quality evaluation, the semiconductor film for film quality evaluation being formed of the same layer as a semiconductor film used to form the transistor, the film quality evaluation region being disposed at one or more locations on the substrate at which neither the transistor nor the signal line is formed; and
    a source/drain region of the transistor comprising a lightly doped source/drain region and a heavily doped source/drain region,
    wherein the semiconductor film for film quality evaluation comprises a first semiconductor film for film quality evaluation and a second semiconductor film for film quality evaluation, wherein the first semiconductor film for film quality evaluation is formed of the same layer as the lightly doped source/drain region and doped with the same impurity at the same concentration as the lightly doped source/drain region, and the second semiconductor film for film quality evaluation is formed of the same layer as the heavily doped source/drain region and doped with the same impurity at the same concentration as the heavily doped source/drain region.

* * * * *